United States Patent [19]
Savaria

[11] Patent Number: 5,276,893
[45] Date of Patent: Jan. 4, 1994

[54] PARALLEL MICROPROCESSOR ARCHITECTURE

[76] Inventor: Yvon Savaria, 2705 Charny, Montreal, Quebec, Canada, H3M 1J6

[21] Appl. No.: 310,828

[22] Filed: Feb. 8, 1989

[51] Int. Cl.$^5$ ............................................. G06F 15/20
[52] U.S. Cl. ............................ 395/800; 364/DIG. 1; 364/229; 364/229.2; 364/229.5; 364/230.6; 364/DIG. 2; 364/931.01; 364/931.41; 370/94.1
[58] Field of Search ...................... 364/133, 228, 228.3, 364/232.8, 240.1, 229.2, 228.6, 925.5, 925.6, 927.6, 931.4; 437/51; 370/94.1; 395/800

[56] References Cited

U.S. PATENT DOCUMENTS

| | | | |
|---|---|---|---|
| 4,038,648 | 7/1977 | Chesley . | |
| 4,191,996 | 3/1980 | Chesley . | |
| 4,333,142 | 1/1982 | Chesley . | |
| 4,517,659 | 5/1985 | Chamberlain | 364/900 |
| 4,598,400 | 7/1986 | Hillis | 370/60 |
| 4,656,592 | 4/1987 | Spannenburg et al. . | |
| 4,703,436 | 10/1987 | Varshney . | |
| 4,745,548 | 5/1988 | Blahut . | |
| 4,763,247 | 8/1988 | Borovski et al. | 364/200 |
| 4,783,782 | 11/1988 | Morton | 364/200 |
| 4,809,193 | 2/1989 | Jourjine | 364/200 |
| 4,814,973 | 3/1989 | Hillis | 395/800 |
| 4,860,191 | 8/1989 | Nomura et al. | 364/200 |
| 4,884,204 | 11/1989 | Seibt et al. | 364/133 |
| 5,008,815 | 4/1991 | Hillis | 395/800 |
| 5,117,420 | 5/1992 | Hillis et al. | 370/94.1 |
| 5,123,109 | 6/1992 | Hillis | 395/800 |
| 5,170,484 | 12/1992 | Grondalski | 395/800 |
| 5,175,865 | 12/1992 | Hillis | 395/800 |
| 5,197,130 | 3/1993 | Chen et al. | 395/800 X |

FOREIGN PATENT DOCUMENTS

| | | |
|---|---|---|
| 0206580A3 | 12/1986 | European Pat. Off. . |
| WO88/01772 | 3/1988 | World Int. Prop. O. . |

OTHER PUBLICATIONS

The Connection Machine, by W. Daniel Hillis, Scientific American Jun., 1987, pp. 108-115.
Parallel Architectures for Vision, by M. Maresca, M. A. Lavin, Proceedings of the IEEE, vol. 76, No. 8, Aug., 1988, pp. 970-981.
Generalized Hypercube and Huperbus Structures for a Computer Network by L. N. Bhuyan; D. P. Agrawal, IEEE Transactions on Computers, vol. c-33, No. 4 Apr., 1984, pp. 323-333.
The Performance of Multicomputer Interconnection Networks, by D. A. Reed; D. Grunwald, Computer, Jun., 1987, pp. 63-73.
Multiprocessor Computing for Images, by V. Cantoni: S. Levialdi, Proceeding of the IEEE, vol. 76, No. 8, Aug., 1988, pp. 959-969.
SMS—A Multiprocessor Architecture for High Speed Numerical Calculations; R. Kober, IEEE, 1987, pp. 236-242.

(List continued on next page.)

Primary Examiner—Edward R. Cosimano
Attorney, Agent, or Firm—Wenderoth, Lind & Ponack

[57] ABSTRACT

A multicomputer chip has a common bus and up to ten microcomputers connected in parallel to the common bus via routers contained in the microcomputers. The common bus can be connected to an external bus by means of a router mounted on or off the chip. Any defective computer found during testing can be rendered inactive by assigning it an unused address and, in this way, the remaining computers are unaffected. Instead of providing each multicomputer on a separate chip, a complete wafer may be manufactured so that it contains many of the multicomputers. A hierarchical bus system interconnects the multicomputers so as to permit efficient routing of data between the various computers.

18 Claims, 19 Drawing Sheets

OTHER PUBLICATIONS

Image Processing on ZMOB, by T. Kushner, A. Y. Wu, A. Rosenfeld; IEEE Transactions on Computer, vol. c-31, No. 10, Oct., 1982, pp. 943-951.

Architecture and Applications of the Connection Machine; by L. W. Tucker; G. Robertson; Computer, Aug., 1988, pp. 26-38.

Interconnection Networks for Parallel and Distributed Processing, by L. N. Bhuyan; Computer, Jun., 1987, pp. 9-12.

Fault-Tolerant Multistage Interconnection Networks, by G. B. Adams, D. P. Agrawal, H. J. siegel; Computer, Jun., 1987, pp. 14-27.

Multiple Bus Architectures, by T. N. Mudge, J. P. Hayes, D. C. Winsor; Computer Jun., 1987, pp. 42-48.

IEEE Transactions on Computers, vol. 38, No. 2, Feb., 1989, pp. 311-313.

Proceedings of the National Computer Conference, vol. 46, 1977, pp. 645-655 Swan et al.

"Hypernet: A Communication-Efficient Architecture for Constructing Massively Parallel Computers", Hwang et al.; IEEE Transactions on Computers, vol. C-36, No. 12, Dec. 1987, pp. 1450-1466.

A = A CLOCK
B = B CLOCK
C = CONTROL CONDITION, FOR EXAMPLE CLOCK AND RESET

PARALLEL MICROPROCESSOR ARCHITECTURE

BACKGROUND OF THE INVENTION

This invention relates to a multicomputer architecture of the type in which a massive number of computers are connected together in parallel. More particularly, the invention relates to a building block for a multicomputer machine, which building block is in the form of a semiconductor die having formed thereon a plurality of individual microcomputers connected in parallel to a first bus on the die, each microcomputer comprising an internal bus to which are connected a microprocessor, a memory and a switch device which interconnects the internal bus to the first bus, wherein the microcomputers can be interconnected to additional components.

Multicomputers using a parallel arrangement of microcomputers have been proposed in which each microcomputer is provided on a separate semiconductor chip and all of the chips are mounted on one or more printed circuit boards and interconnected by means of a common bus provided on the printed circuit boards. Yet other arrangements have been proposed in which massive numbers of microcomputers mounted on several printed circuit boards are interconnected by various forms of sophisticated interconnection networks such as a hypercube implemented by means of numerous cables. Yet other arrangements have been proposed where a moderate number of processors sharing a common control in a single instruction multiple data mode are mounted on one physical die. These latter processor would not qualify as microprocessor since they lack some essential functionality such as autonomous instruction decoding and memory addressing.

One drawback of these prior proposal is that the physical size reduction of the multicomputers is limited. Furthermore, the cost of packaging and interconnecting multiple chips is high.

An article entitled "Hypernet: A Communication-Efficient Architecture for Constructing Massively parallel Computers" by Messrs. Hwang and Ghosh published in IEEE Transactions on Computers, Vol. C-36, No. 12, December 1987 describes a multicomputer machine which is constructed of a number of basic modules each consisting of a set of interconnected nodes which is an abstraction for a processor/memory/switch element. In one embodiment described with reference to FIG. 1(d) of the article the nodes are connected to other nodes in the same module through a common bus. Each node can also be connected to a node of another module or, in the case of a special node, directly with the outside world. As each node can, according to one interpretation, be considered a microcomputer, Hwang and Ghosh therefore discloses a building block as set down in the preamble of this application.

In the Hwang and Ghosh proposal each node has dual ports, one port for connection to the common bus and another port for communicating or linking directly with a node of another module. Moreover a special node has to be provided which, in addition to providing a port for connection to the common bus, provides a port for connection to the outside world. Thus, the Hwang and Ghosh proposal involves a great number of communication links and, moreover, different types of links (one type for node to node, another type for node to external world).

Hwang and Ghosh refer to an algorithm for message routing but this is not described in detail. However, it seems clear that such an algorithm would have to be executed as a complex software program because of the complex arrangement of communication links.

Another problem with the Hwang and Ghosh proposal is that, because communication is directly through a module, a defective processor destroys the link with another module.

The Hwang and Ghosh article states that large networked machines "may be constructed with WSI technology in the future". WSI (Wafer Scale Integration) implies the use of a single chip. However, it is clear from the geometry of FIG. 3(b) of Hwang and Ghosh that this would not be easily accomplished.

SUMMARY OF THE INVENTION

It is an object of the present invention to overcome these disadvantages. This achieved in that the switch device is a router which has a single data link which interconnects the internal bus to the first bus only, interconnection of the microcomputers to the additional components being achieved via a further router external of the die to which further router the first bus is connected and a bus external of the die is connected and in that means are provided on the first bus for resolving access conflicts between the microcomputers.

In an alternative embodiment of the invention, the further router is provided on the die instead of external of the die. In either case, communication between the microcomputers of one die and those of another die or between the microcomputers and the external world is achieved through the further die and then an external bus. Communication is not through a processor or computer itself so that if a microcomputer fails, the link is retained.

The simpler arrangement of the invention permits easy implementation of WSI so that a multicomputer machine can be constructed on a single wafer.

When the microcomputers are tested, only those which pass all of the tests are given logical addresses. Any microcomputer without an address simply stays in the standby mode By including in each chip more microcomputers than necessary, a redundancy is built in so that an effective yield for useable multicomputer dies close to 100% can be achieved.

In some of the multicomputer machines of the prior art, a pool of memories and processors share a common bus. One problem with a single or global bus is that the processing power rapidly saturates the I/O bandwidth.

This drawback is overcome, according to the present invention, by subdividing the global bus into two or more first level buses which each interconnect separate parallel groups of computers by means of routers in the computers. The various first level buses are interconnected by a higher level bus in a hierarchical manner using higher level routers. As many levels as is required to make sure no bus becomes saturated are chosen.

The use of hierarchical buses together with multicomputer chips permits machines of the complexity of the so-called Connection Machine (W. D. Hillis, MIT Press, Cambridge, Mass. 1985) to be implemented in a much simpler manner.

The hierarchical bus system of the invention is not restricted to complete computers as it can be used ad-

BRIEF DESCRIPTION OF THE DRAWINGS

FIG. is a simplified block diagram of a multicomputer chip according to the invention.

DESCRIPTION OF PREFERRED EMBODIMENTS

Figure 1:
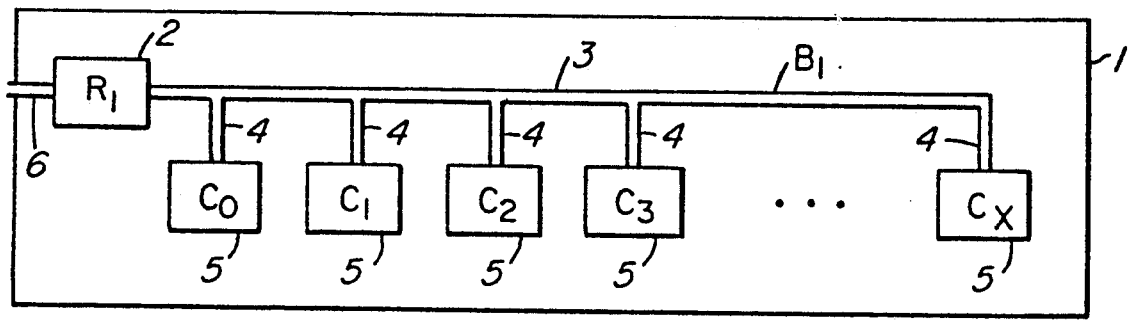

With reference to FIG. 1, a rectangular chip 1 includes a router 2 located near one corner of the chip and connected to a bus 3 which runs virtually the entire length of the chip. Extending at right angles to the bus 3 is a plurality of short buses 4 each of which interconnects a (micro)computer 5 to the bus 3. Logically, all of the buses 4 can be considered part of the bus 3 which will be referred to hereinafter as bus $B_1$. All of the computers 5, which are connected in parallel to bus 3 are identical and, typically, there would be up to 20. A further short bus 6 extends from the other side of the router 2 from which the bus 3 extends and terminates at the end of the chip 1 for connection to external circuitry. Bus 6 would form part of the next higher level bus $B_2$.

Figure 2:
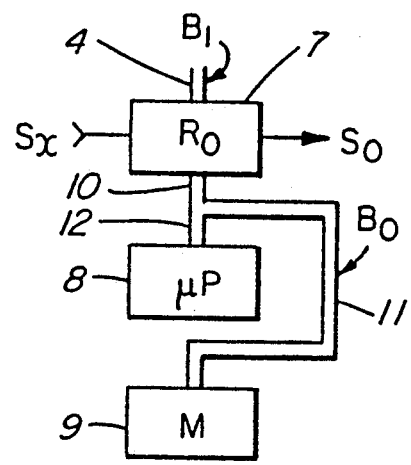
FIG. 2 is a simplified block diagram of any one of the identical computer used in the chip of FIG. 1.

Referring now to FIG. 2, this shows in simplified form the components of a single computer 5. These comprise a router 7, a (micro)processor 8 and a memory 9. The router 7 has one end connected to bus 4 and the other end connected to a short bus 10 which is in turn connected to one end of a bus 11 the other end of which is connected to memory 9. The processor 8 is also connected to bus 11 via a short bus 12. Logically, buses 10 and 12 can be considered part of the bus 11 which will be referred to, hereinafter as bus $B_0$.

Figure 4:
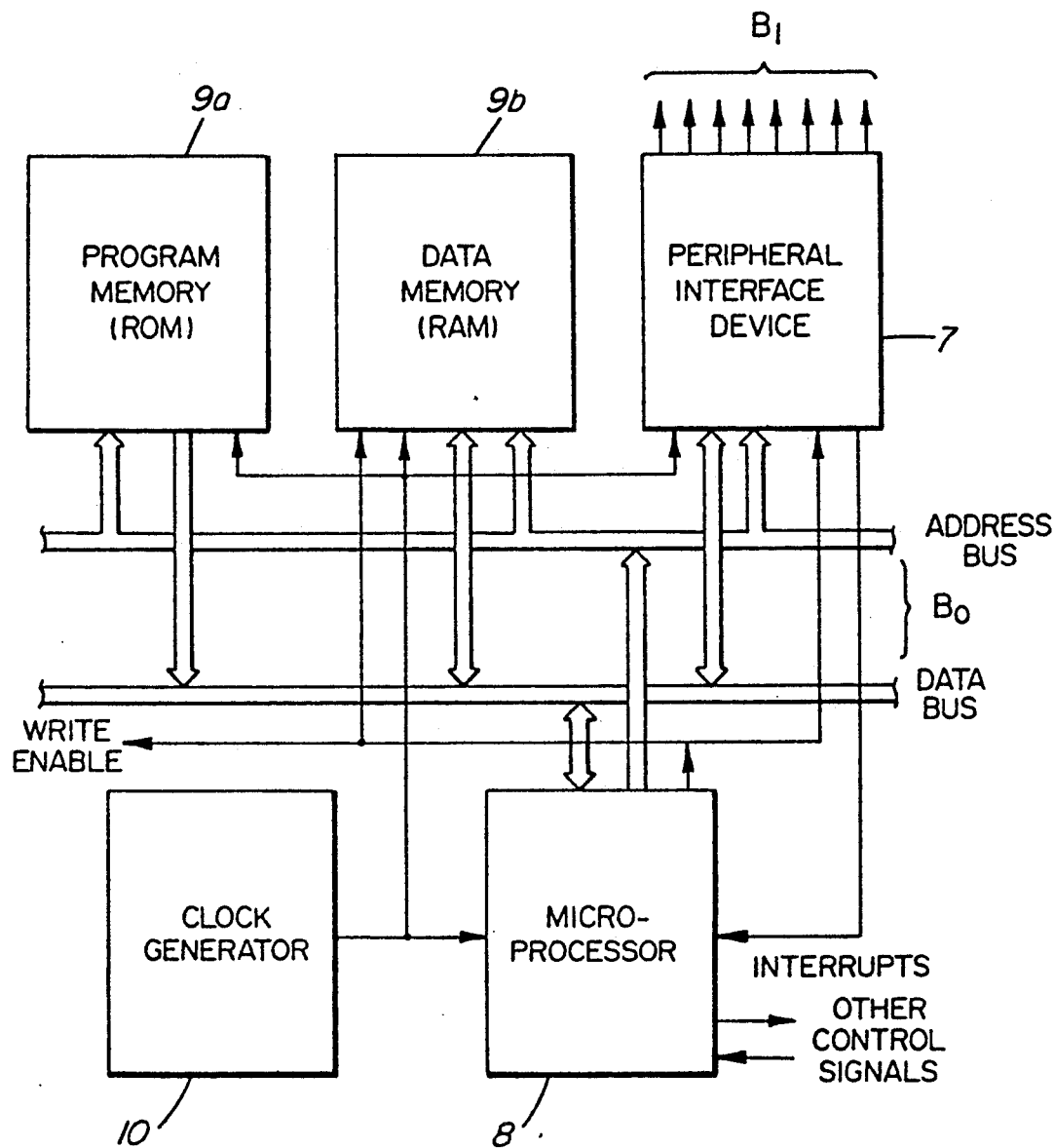
FIG. 4 is a block diagram of the computer illustrated in FIG. 2 but showing more detail than FIG. 2.

The microcomputer of FIG. 2 is preferably configured in a manner similar to a conventional single chip microcomputer as illustrated in FIG. 4. Thus, memory 9 includes 512 bytes of ROM program memory 9a and 8 kilobytes of dynamic RAM data memory 9b and router 7 could be considered a specialized form of I/O interface. Processor 8 could take the form of many different presently available microprocessors, such as the Motorola 6802 or the Rockwell 6502. Bus $B_0$ is a conventional microprocessor bus comprising a data bus, an address bus and various control signal lines such as interrupts, write enable and the like. A clock generator 101 is connected to clock memories 9a and 9b, router 7 and microprocessor 8.

In general, the router 2 or 7 is a gateway between two buses of consecutive hierarchical levels. The bus $B_0$ within each computer 5 is at the lowest hierarchical level and the bus $B_1$ interconnecting all the computers 5 on a chip to router 2 is at the next highest hierarchical level. Buses used externally of the chip 1 will have higher hierarchical levels as will be described below. The lower of the two buses interconnected by a router determines the level of the router. Thus, router 7 is designated $R_0$ and router 2 is designated $R_1$.

The expression "gateway" is used in a sense close to its meaning in the field of local area networks (LANs). A router can thus receive messages from a source computer in lower hierarchical levels. The messages are organized in packets and in general, they follow an ascendant phase and a descendant phase to the destination computer. There can clearly be one or more destinations for a message when broadcast of information is required in subgroup or to the whole system. As their name implies, routers are responsible for the management of the communication protocol. We propose that each bus above level 0 is actually a multibit local area network very similar in concept to either an Ethernet or a token ring. One should note that we have an extremely-local area network, and thus for example the full Ethernet protocol is most probably too complex to be implemented at a reasonable cost. We have in mind a much simpler token ring protocol capable of resolving access conflicts at a much reduced cost. Level 0 routers are slightly different because they do not interact with a LAN at level 0 but are capable of direct interaction with the computer. The two different types of routers will be described in greater detail below.

Figure 3:
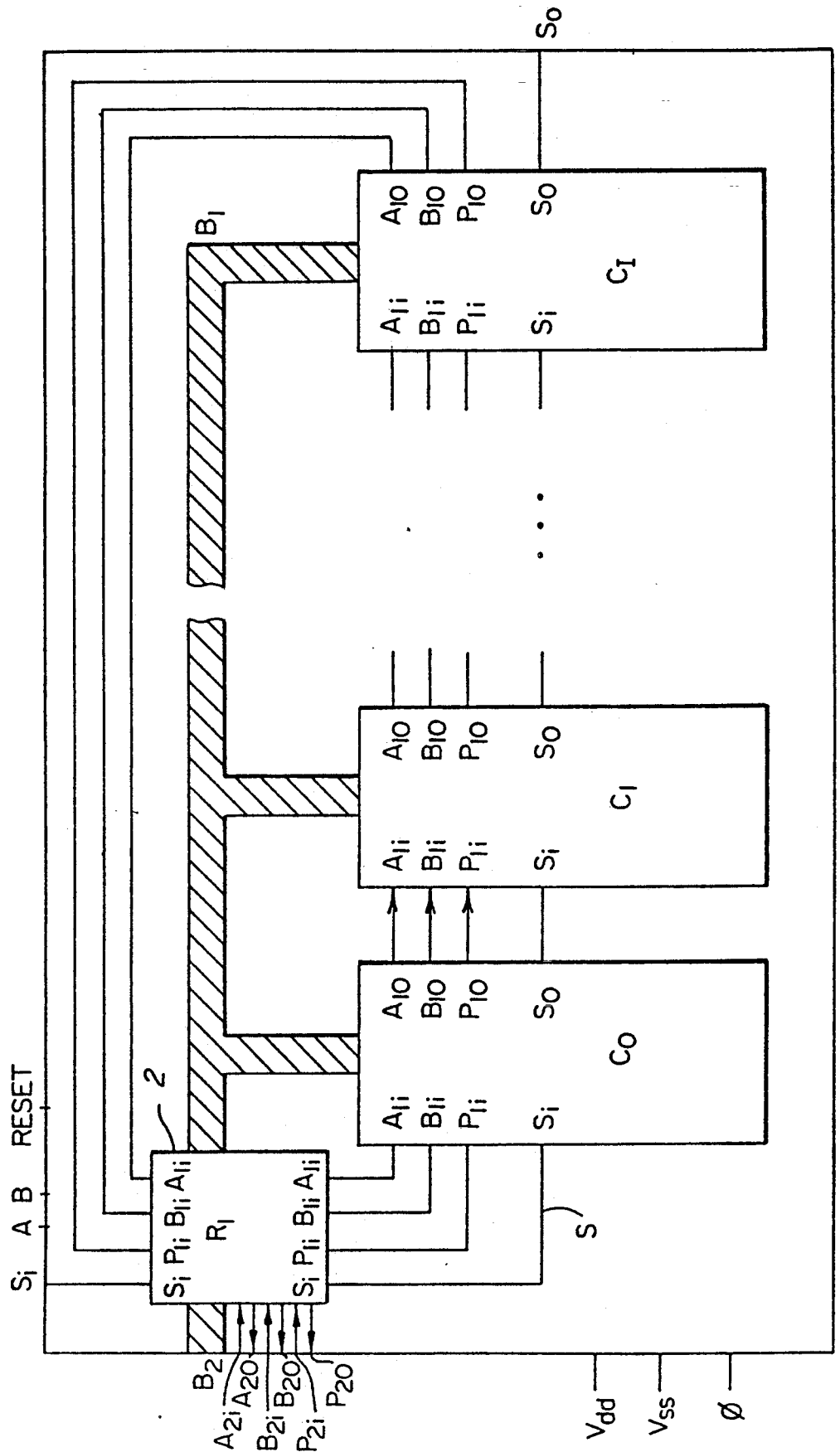
FIG. 3 is a block diagram similar to FIG. 1 but showing more detail than FIG. 1.

Referring now to FIG. 3, which is an expanded view of FIG. 1, the bus $B_1$ contains no separate address bus, in contrast to the lowest level bus $B_0$, but comprises 8 bidirectional lines only which are used to transmit all relevant information (addressing, control and useful data). In general, bus $B_2$ and all higher level buses are all identical to bus $B_1$. However the width of some of these buses can be adjusted (increased or reduced). In addition to bus $B_1$, three loops, namely an A-loop, B-loop and P-loop, are provided on the chip 1. These each consist of a single line from the $R_1$ router 2 through the various computers 5 and back to router 2. Furthermore, a bootstrap and test scan chain line S is connected from the $R_1$ router through the $R_0$ router of each computer in turn. FIGS. 2 and 3 illustrate the input $S_I$ and output $S_O$ of the test scan line for each $R_O$ router.

Various signal lines on the chip 1 extend to the edges of the chip where they can be bonded to individual pins (not shown) of a DIP module (not shown). These lines include the eight lines of the bus $B_2$ from the $R_1$ router, input and output lines from the $R_1$ router for each of the A, B and p-loops, an input to the test scan line $S_i$ which goes to the $R_1$ router and an output from the test scan line $S_0$ which comes from the last computer on the chip. Also provided are bond pads schematically indicated at A and B for two clock signals for controlling the test scan function, one or more bond pads $V_{dd}$ for positive supply voltage to the chip, one or more bond pads $V_{ss}$ for reference supply voltage to the chip, one or more bond pads $\phi$ dedicated to feeding clock signals and a master RESET bond pad. The connections of these bond pads to components within the die are omitted for clarity but it is to be understood that these bond pads would be connected to the $R_1$ router and the microcomputers C. In all at least 22 pins have to be provided.

The functions of the A, B and P-loops and the bootstrap and test scan chain line S will now be described. The A loop is a true loop which latches the occurrence of activity on the level K bus (K>0) to which it refers. It is the responsibility of the router that takes the bus to reset the A loop.

The B loop is used to resolve conflicts by assigning a token to a master router on a bus of level K (K>0). The master dynamically breaks the B loop in order to resolve rapidly any contention for the bus. A router can simply take the bus if it is the closest to the master and if it generated a request for the bus in an inactive bus cycle.

To ensure fairness in the bus access, the token which defines the master router on each bus can either be circulated on a dedicated priority loop (P-loop) or on the B-loop as explained later.

A router can be assigned precedence in the bus usage if it is allowed to keep the token for more than one bus cycle under the control of a counter. This is straightforward to implement.

The necessity for a scan chain passing through all routers follows from the fact that we expect defective computers in the multicomputer chip and we need mechanisms to lock them out from the system. Each computer that is found to be working after the test procedure under control of the scan chain will be given a logical address still under the control of the scan chain. The routers only need the logical address of the destination in order to accomplish their task effectively. Note that logical addresses are used in an associative manner, and thus we achieve a behavior very close to what is normally called global redundancy in the community of designers of defect tolerant integrated circuits. Note that higher level routers must have the capability to either store data packets in progress or must have total priority over computers in the bus system. The best performance is achieved with a judicious mix of these two strategies. In addition, a router with a congested buffer can simply stop to acknowledge messages which would be interpreted by the senders as an indication that the immediate destination cannot accept the message because of overloading of its buffering capability.

Additional level 1 routers can obviously be added to this chip at a cost of one additional level 1 router and 14 additional physical pins.

The linear arrangement used in FIG. 3 is only for convenience and there exist numerous ways to layout a logically equivalent chip by placing the individual computers on as many rows as required, joining the rows at one end of the array for example.

It is not necessay that all computers inside this chip be good for the chip to be usable. Provided that the critical portion of a defective computer is not defective, it can be left out of the system by assigning to it an unused logical address. Critical defects would be those which have adverse effects on the remaining blocks, for example a break in the A and B loops or scan chain or a short between $V_{dd}$ and $V_{ss}$. Non-critical defects are those solely relating to the computer in question, for example a defect in the microprocessor or memory.

An alternate method of leaving defective computers out of the system is to use physical addresses which would be hardwired into the level 0 routers. In this case the sender would be responsible for using only addresses of computers which are not defective. The portions of the addresses interpreted by routers of level 1 and above would still have to be assigned, and possibly stored in some non-volatile memories.

The difference between a level 0 bus and all the busses at a higher level shall now be clear. A level 0 bus is private and the microprocessor is usually the master of this bus unless some peripheral circuitry is equipped to take control over the bus. This happens if the peripheral device is capable of direct memory access control, but this type of feature is usually transparent to the execution of the program and thus invisible to the programmer. Thus at level 0, a processor does not generate a request for the bus; it owns it for communication to its local memory during processing and also for communication to its peripheral devices. The address bus which determines the location in memory to which a current instruction applies is also an essential feature of the level 0 bus. By contrast, all busses above level 0 are shared and a router must wait until permission is granted before it can use it. Note that there is no address bus and we are left only with 8 bidirectional lines used to transmit all relevant information (addressing control and useful data). The presence of the loops for contention resolution is one distinguishing feature of all buses above level 0 in the basic embodiment. One could use protocols where the A, B and P loops are not needed. One existing embodiment of such protocol where contention resolution also takes place through the data channel is the carrier sense multiple access with collision detection used in the well known Ethernet.

The test and bootstrap scan chain will now be described in greater detail with reference to FIG. 5.

A scan chain is a glorified shift register. Provided that each router has an input and an output for the scan chain it can virtually be extended to infinity by still requiring a mere 4 pins no matter how complex the chip becomes.

A scan chain is generally controllable directly from primary inputs of every chip. This is the purpose of the A and B clocks. Two clocks, one input and one output constitute all the input-output requirements. When there are multiple modules (routers or chips), the A and B clocks are connected in parallel (not shown in FIG. 3)

and the scan-in and scan-out are connected in cascade (shown in FIG. 3).

A shadow of the scan chain is also required. This is another well known concept to test engineers. FIG. 5 shows a scan chain with a shadow scan chain. The purpose of the shadow is to store the contents of the chain while it is being reloaded with another pattern. It provides the same functionality as two scan chains but with the same number of pins as one at the expense of time overhead.

Figure 5:
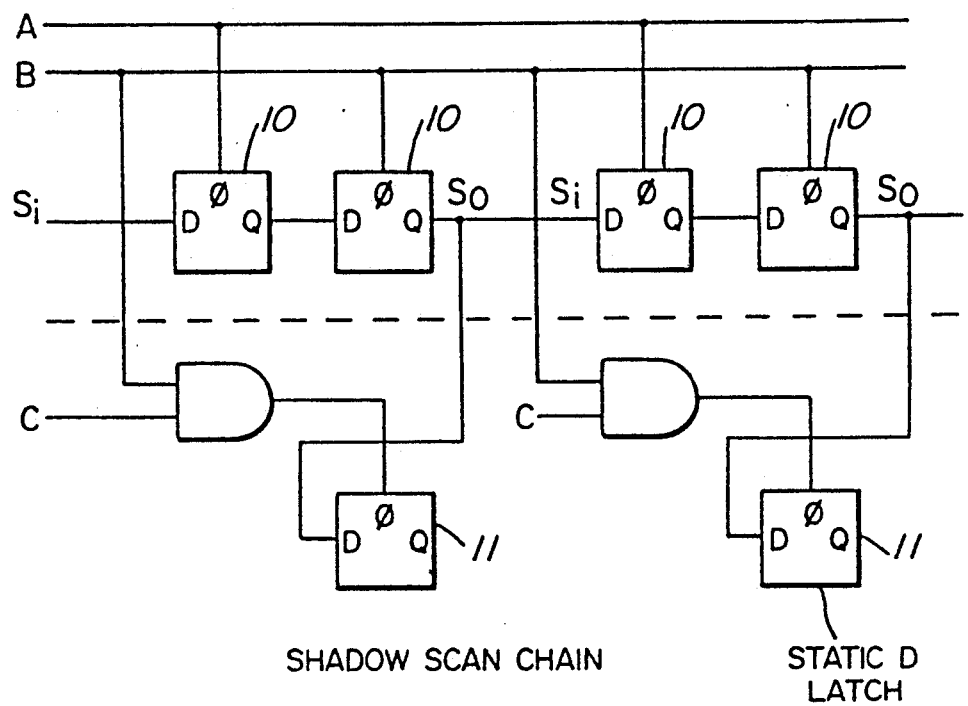
FIG. 5 is a block diagram illustrating a test scan chain.

FIG. 5 shows two bits of the test scan chain. One bit of this scan chain is included in each router. Two D-latches 102 controlled by the A and B clocks form a conventional shift register which can be loaded without using the $\phi$ clock. The third D-latch 103 is the shadow latch. Let us define the control signal C as the logical combination RESET and $\phi$. If B and C are both true, the content of the scan chain is transferred into the scan latches. As long as C is false, the content of the shadow latches remains unchanged. During this time interval, the scan chain can be reloaded with a different pattern. Note that the patterns in the scan chain and in the shadow latches can be as different as required.

The system possesses three clock signals, two for the scan chain and one for normal operation. It is possible to exercise the scan chain with a long sequence of A and B clock pulses without pulsing the system clock. Therefore the system can be frozen while the scan chain is being loaded. We shall not be concerned at this stage with losing the content of main memory which is dynamic because this feature of freezing the system while the scan chain is loaded is only used at times when the contents of dynamic memories is not yet important.

Note that a master reset is included in FIG. 3. The reset is used as follows:

1—reset for one cycle (of the main clock when not mentioned specifically) effect a reset on all the A loops in the system.
   it is obviously necessary before the bootstrap procedure can proceed
   this feature is to be used when a computer under test is defective and cannot release the bus it has taken
   also controls the latching of the contents of the scan chain into a shadow scan chain.
2—reset for two consecutive cycles,
   set to a predetermined unassigned value all the logical addresses
   put all the routers in the system in a neutral mode by suitable initialization of internal constants
   reset all the individual computers.

Clearly, some delay after a pulse of two cycles on the reset line, the whole machine is in a neutral quiet state. The reason for the delay is that part of the initialization job can be done by the individual computers and that would require some delay. Recall that each computer possesses some ROM which contains necessary bootstrap information. The portion of the program which deals with initialization is clearly necessary, but also that portion of the program which deals with the communication protocol shall probably be stored in ROM since it is not supposed to change for the entire life of the machine and ROM is more compact than RAM and not subject to soft errors. Clearly, no critical initialization operation should be assigned to the computers because they would become critical circuitry as far as yield is concerned.

Necessary always used when the computer is good.
Critical: used to lock out a defective computer.

Let us define the core of the system as the MA (master) block and the MM (main memory) block. If the core is defective the machine is incapable of testing itself and is also incapable of bootstrapping; or at least, nothing can be guaranteed. One of the essential functions of the core is to manage the following functions,
test
self-test
bootstrap.

The core is an autonomous computer assumed to be non-defective. It knows through its program about the actual structure of the machine including the path of the scan chain.

The core controls the RESET line, the A clock, the B clock and the normal system clock.

All routers can be made transparent if they contain 1 both in the scan chain and in the shadow.

A router knows for sure that it is being interrogated by the core when its scan chain contains 0 and its shadow contains 1. By convention, the addressed router listens when $\phi=0$ and answers when $\phi=1$ ($\phi$ is the system clock). Clearly the core can build a continuous bus between itself and any portion of the machine for the purpose of test. Clearly this cannot run at full system speed because of the delays incurred through the chain of router. Full speed testing shall be accomplished by self-test.

A router knows for sure that it is being assigned one or more logical addresses by the core when its shadow contains 0 and its scan chain contains 1. In which case each new pulse of the main clock is used to control storage of these addresses into the appropriate resisters according to a suitable predetermined protocol.

A router that contains 0 both in the scan chain and in the shadow stay inactive.

Thus, the scan chain defines four different states or conditions, namely (1) Transparent,(2) Active under Test, (3) Active for set up of Logical Addresses and (4) Inactive. When a particular computer has been set up as Active under Test, a test can now be administered by the master. If, as indicated previously, a defective computer is found, a logical address which is not intended to be used is assigned to that computer when the scan chain moves to the level Active for set up of Logical Addresses.

Figure 25:
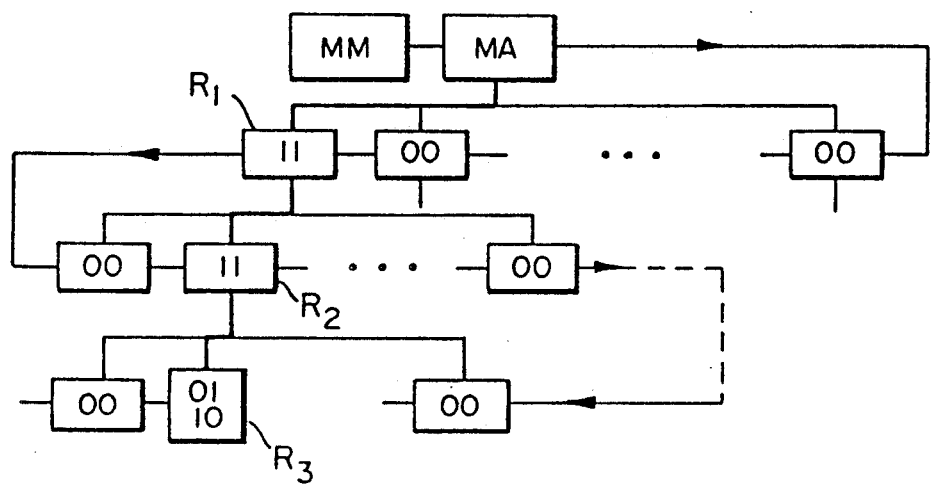
FIG. 25 illustrates diagrammatically how test via a scan chain is achieved.

FIG. 25 illustrates the situation where a router $R_3$ has just been tested. A path or route is established from the Master MA through routers $R_1$ and $R_2$ in turn, both of these routers being transparent because the scan and shadow both contain 1, to router $R_3$. As router $R_3$ contains a 10 as the last condition it is in the state for receiving logical addresses ±rom MM.

we shall now describe full speed self-test,

Clearly the above procedure is capable of establishing the machine into a mode where all processors which passed the test are declared good and assigned logical addresses.

The same is true with routers.

We cannot guarantee
1) that they are really good, they just passed the test
2) that they really work at full speed.

The basic idea is very simple, we have a number of computers that were declared good and even if the test set is only of a moderate quality, most of the modules which are declared good indeed are. Since they are physically identical, except if they have some defect, they should generate exactly the same output sequence when they execute the same program. Since self-test would take place in parallel, test sequences much longer than those applied previously make sense here.

Three kinds of self-test are possible,

Groups of identical computers execute the same program and compare their results by means of the bus using normal system operation. At all times, one is a broadcaster, the others are listeners. If groups are larger than two, finding one defective computer by means of comparing test results is obvious. If all the members of a group agree, they are declared good since the likelihood for all of them to have the exact same defect is virtually 0. A defect in their common bus would not be found by this procedure, but such defect would be obvious to detect in the system test phase, moreover, it is natural to use larger portions of the complete system that can again be compared by the same method, in which case, the individual buses that constituted common circuitry at one level are no longer common circuitry. In case of discrepancy, we delegate the diagnostic task to the core which is assumed to be good.

During normal operation, let us say for the first month, half of the computers would be programmed to behave as shadows. Any discrepancy discovered by the shadow computers would be reported to the core. The core would then assign two shadows to form a triplet where a discrepancy was observed, it would then rerun the portion of program that caused that difference to be observed and if the discrepancy is re-observed within a short interval, the core can then diagnose the failing computer. If the discrepancy is not re-observed, it was a soft error but it is remarkable that the machine did not let it go. This protection against soft errors can also be extended to all the bus system and the routers if the shadow also duplicates all messages (synchronisation is a little more difficult but it can be done). The task of performing the comparisons in real time should be effected by the level 0 routers (some extra hardware is required if this feature is desired). In this mode, very reliable operations would result.

Also during normal operation, if the core assigns one shadow computer every 20 computers, a computer that becomes defective due to aging will easily be detected. It is the responsibility of the core to re-program the shadow computer for it to become the shadow of all the other computers one at a time. After detection of a discrepancy, two shadows are assigned as above. This mode would offer a reduced reliability since no tolerance to soft errors is provided, but the overhead is obviously much lower.

We will now discuss the bootstrap procedure.

Load the shadow scan chain with 0.

Feed the test and bootstrap scan chain with a 1 at every cycle of the A-B clock pair.

Assume the scan chain is properly wired.

Assume a sequence of logical addresses to be assigned has been pre-computed and is available in MM.

A fairly simple sequence of pulses on the main clock and reset line can be devised to produce a marching 1 in the scan chain and in its shadow as shown here.

| Step i     | 11110000 | scan chain |
|            | 11110000 | shadow     |
| Step i + 1 | 11111000 | scan chain |
|            | 11110000 | shadow     |
| Step i + 2 | 11111000 | scan chain |
|            | 11111000 | shadow     |

The router at the edge of the marching is with 10 in the scan chain and its shadow would be addressed and would receive logical addresses pulled from main memory MM one byte at a time.

The bootstrap is completed by putting a chain of 0 in the scan chain and in the shadow scan chain.

One more pulse on the reset line and the system is up and running ready to receive normal code broadcasted by the core.

Clearly, all that is absolute)y needed in a low-cost implementation is the bootstrap procedure with the pre-computed sequence of logical addresses. Test could be effected under control of external test hardware. Self-test is obviously optional. The complexity of the test and self-test procedures discussed above is not to be taken lightly. A great deal of effort is required to program it and it may not be appropriate to put the hardware to execute it into every instance on the proposed machine.

Figure 6:
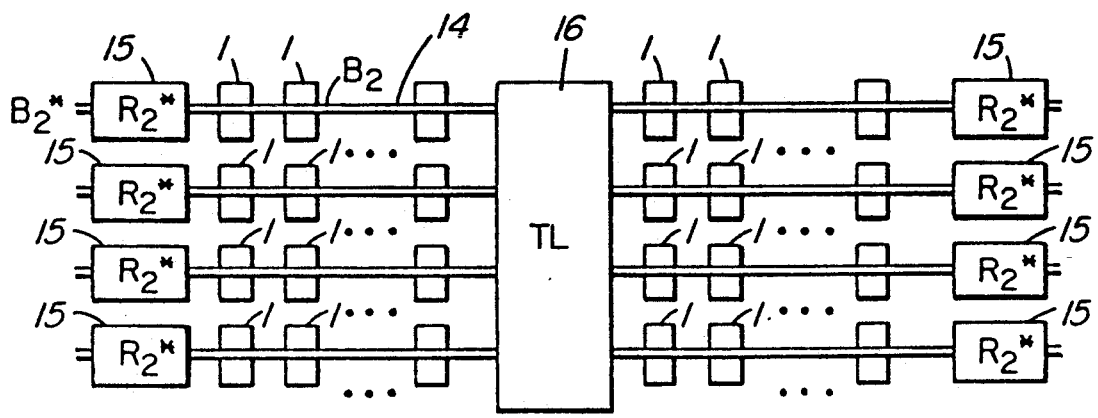
FIG. 6 is a schematic view illustrating how the chips of FIG. 1 could be laid out on a printed wiring board.

Referring now to FIG. 6, this shows a single-board supercomputer using the chips 1 of FIG. 1. The chips 1 are assembled in groups of up to ten chips. Each group of ten chips is laid out in a row on a printed wiring board and interconnected by means of a level 2 bus ($B_2$) numbered 14. There are eight $B_2$ buses each of which is connected at one end to a respective $R_2$* router block 15. Each router block 15 is an I/O computer merged with a level 0 router and is not necessarily provided on a single chip.

Figure 7:
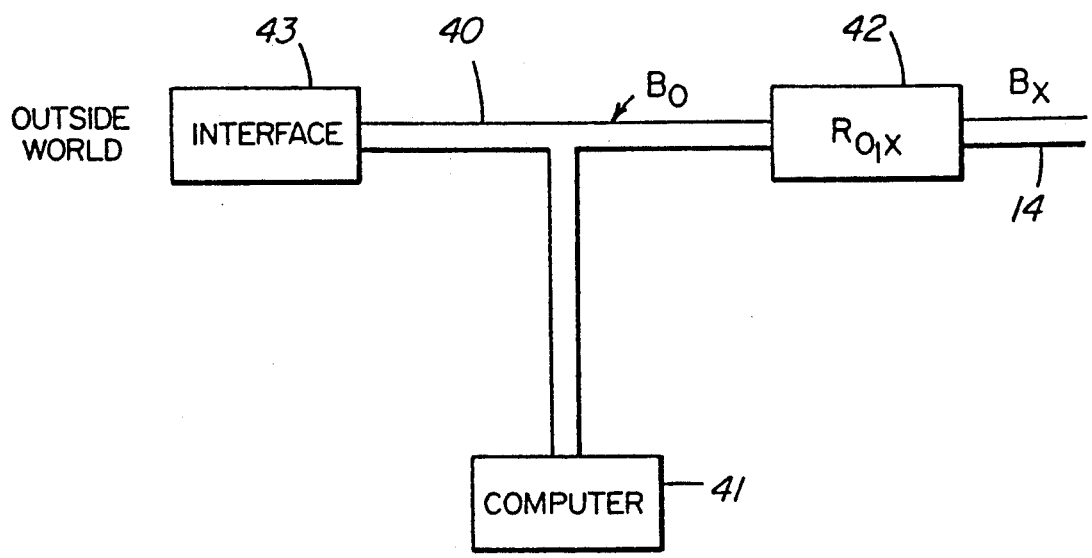
FIGS. 7 and 8 are block diagrams illustrating the details of two components shown generally in FIG. 6.

An $R_2$* block in FIG. 6 is illustrated in more detail in FIG. 7. It is composed of level 0 bus 40, a computer 41, an $R_0$ router 42 and some type of interface 43 to the outside world. We shall now comment on each of these elements.

The machine will have to comply to some standard interface i f it is going to be possible to connect it to outside world. Some possible standard interfaces are, RS232, Terminal or low speed peripheral ETHERNET, A standard local area network VME bus, PC bus or Multibus I and II, some very popular standard buses.

SCSI: standard for interface to peripheral devices such as disk drives.

Most probably, there is a necessity to translate between the standard communication protocol and the internal communication protocol. This is the purpose of this computer. FIG. 4 is an acceptable block diagram for a computer. This computer can take several detailed forms and the use of complex state-of-the-art microprocessor such as the Motorola 68030 or the SUN SPARC is a clear possibility with such processors being equipped with as much as 16 megabytes of memory. At this stage, the peripheral computer would have a complexity comparable to commercially available state-of-the-art workstations. Since a bus such as the VME bus is one possible embodiment for a $B_0$ bus, all of this could be external to the machine if we possess an $R_0$ router chip capable of connecting directly to a VME bus.

Figure 8:
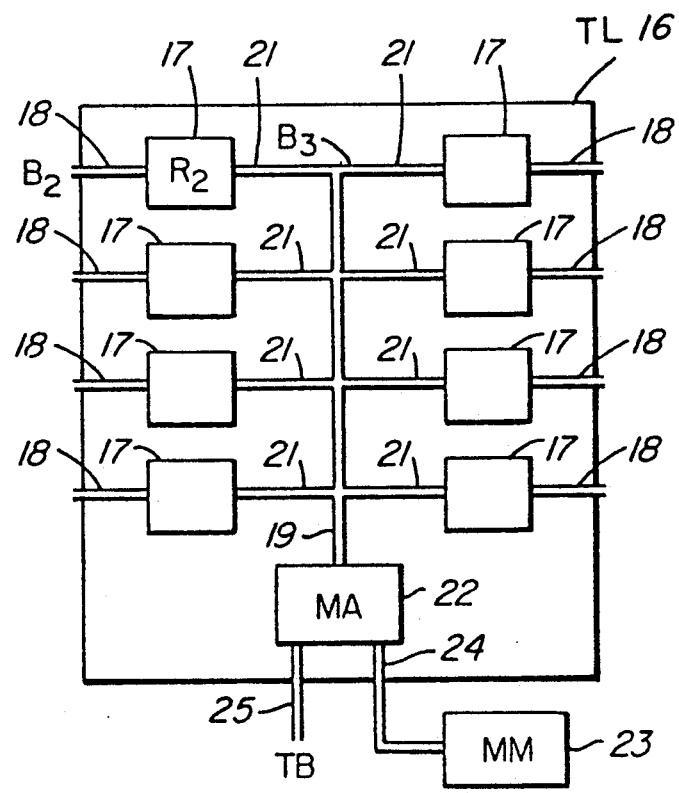

The eight $B_2$ buses are arranged in two different columns, one to the right of a top level (TL1 block 16 and one to the left of block 16. FIG. 8 illustrates the details of TL block 16. This includes four $R_2$ routers 17 located near the left hand edge of block 16 and four $R_2$ routers 17 located near the right hand edge. Each router 17 is connected to a short bus 18 which extends to the edge of the block and is a continuation of a respective one of the $B_2$ buses 14 of FIG. 6.

Running vertically down the centre of block 16 is a $B_3$ bus 19 to which the $R_2$ routers 17 are all connected by means of short parallel buses 21. Logically buses 21 can be considered part of $B_3$ bus 19. Connected to bus 19 is an MA block 22 which is, in turn, connected to an MM (main memory) block 23 by means of a bus 24. Also connected to MA 22 is a TB bus 25.

The MA block in FIG. 8 is the master of the system capable of booting it from instructions located in MM. The MM block is a memory also responsible for holding the programs. This memory could be Volatile or non-volatile as a function of the application. The TB label of bus 25 refers to the top level bus that can be used for entering data. In the specific embodiment described here, buses of levels 1, 2 and 3 are very similar in the supported communication protocol but we propose 8 bit parallel datapaths for level 1 and 2 and 32 bits for $B_3$. It is clear that the TL block can easily be implemented with commercially available gate arrays which allow complexity as high as 100 thousands gates (we believe that on the order of 20 thousand would be required for this chip). Moreover packages are now available with in excess of 200 pins which is sufficient for the task. One should note that the complexity of the class of machines proposed in this invention can be extended to much larger machines if one now uses the chip developed for implementing the level 3 bus as a level 4 or level 5 bus. Some slight modifications would be required to FIG. 8 but the architecture would be essentially the same.

The arrangement shown in FIG. 6 can be implemented without the use of a printed wiring board, using wafer scale integration (WSI) meaning that there is only one chip per wafer. In such an embodiment, shown in FIG. 9, a wafer 27 includes a multiplicity of individual computers, routers and hierarchical buses as described with reference to the first embodiment, FIGS. 1 to 8. The notion of a segment is additionally introduced. A segment of level 1 is all the buses, routers, and computing elements confined within routers of level 1. The notion of segment is useful to discuss what is a replaceable unit in the presence of one or more defects.

Figure 9:
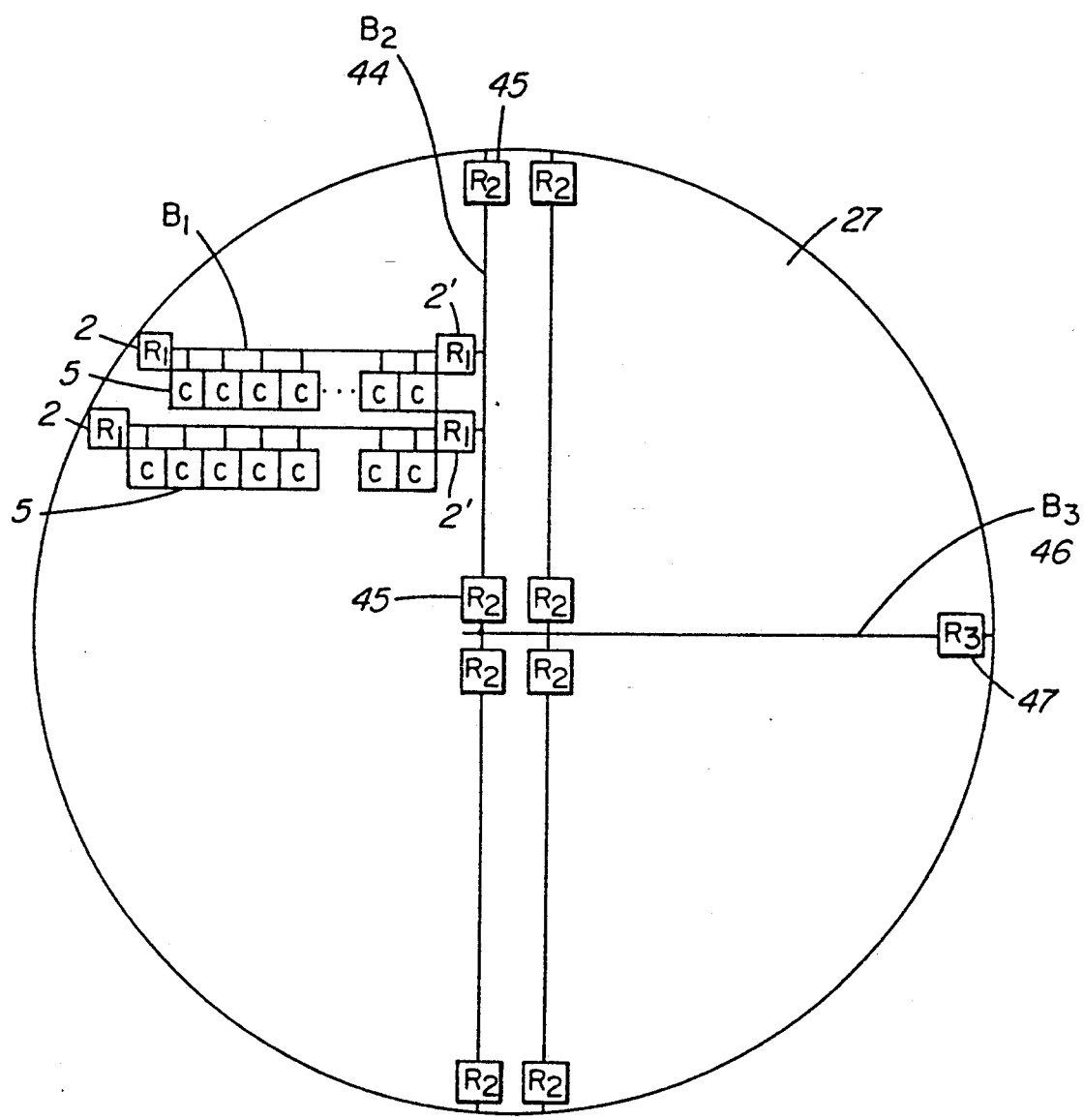
FIG. 9 is a schematic view of an arrangement logically similar to FIG. 6 but carried out entirely on a semiconductor wafer.

FIG. 9 shows an embodiment of a system of a complexity comparable to the whole printed wiring board sketched in FIG. 6. This is possible because a 15 cm wafer in a one micron technology available today can hold approximately 160 millions transistors. Therefore, despite the presence of buses and routers it is not unreasonable to expect from 1000 to 1400 working computers from a single wafer.

Each level 1 segment in FIG. 9 is analogous to a multicomputer chip shown in FIG. 1. Only two level 1 neighbouring segments are shown for clarity but the rest of the area of the wafer would be covered by as many segments as it can hold. Note that they are all laid out in parallel non-overlapping rectangular area. It is estimated that a 15 cm wafer could accommodate as many as 50 independent level 1 segments. Segments can always be merged together if one wants to reduce their number or increase their complexity. The latter possibility is clearly to be considered for the shorter segments that would arise at the top and at the bottom of the wafer shown in FIG. 9. A level 2 ($B_2$) bus 44 can clearly be laid out orthogonally to a subset of the pool of available level 1 segments, the bus 44 being terminated by an $R_2$ router 45 at each end thereof. This can clearly be repeated to form a level 3 ($B_3$) bus 46 interconnecting 4 $B_2$ buses 44 shown in FIG. 9. An $R_3$ router 47 is provided at the wafer edge of bus 46. It should be clear that FIG. 9 is a straight transposition of the architecture in the first embodiment to a wafer scale technology. With 50 level 1 segments, 4 level 2 segments and one level 3 segment and a design identical to FIG. 3, there would be a need for 440 data pins, 440 control pins, 150 clock pins and at least 55 pairs of supply connections for a total of 1140 pins. With WSI technology it is possible to fit as many as 2000 pins around the wafer periphery.

The main advantage associated with wafer scale integration is clearly the elimination of the packaging costs associated with putting a comparable amount of silicon in a large number of individual packages plus the fact they have to be assembled and soldered o the printed wiring board.

The embodiment in FIG. 9 possesses the property that not only can it tolerate defects in the elementary computers as was the case in the multicomputer chip in FIG. 1, but it can also tolerate defects on critical resources which make a complete level 1 segment unusable. Since from the periphery we have access to each segment, they can all be equipped with private clock and power wires. The benefit on the wafer yield would normally offset the cost associated with duplicated block and control signals since for such a large chip, the probability of not having a short between power rails or on a critical signal would be close to 0. Note that for power pins, the power requirements of each level 1 segment exceeds what can be supplied by a single pair of pins, therefore there is really no overhead associated with independent supplies. Alternative methods for confining critical signals exist but they normally require either cutting fuses or adding some extra logic which is clearly not required here. The cost of the extra logic is significant but the fact that this extra logic generally boomers critical by itself is a more significant problem, its elimination is then a significant improvement.

One non-trivial improvement between the first and second embodiment is the use of routers at both ends of every bus. This could have been used in the first embodiment and will be demonstrated in the third. The benefit that one gets from terminating all buses by a second router becomes apparent when one tries to use a WSI chip as the one shown in FIG. 9 as one component of a larger system. The connectivity of the hierarchical bus system is improved significantly. We will come back later to this feature but we shall only stress that adding routers at both ends of every bus does not disrupt the regularity of the layout and in general results in a moderate additional cost (it clearly increases the pin count for a chip such as the one shown in FIG. 1 and one has to weigh the benefit in performance for a given application with the additional cost).

Figure 10:
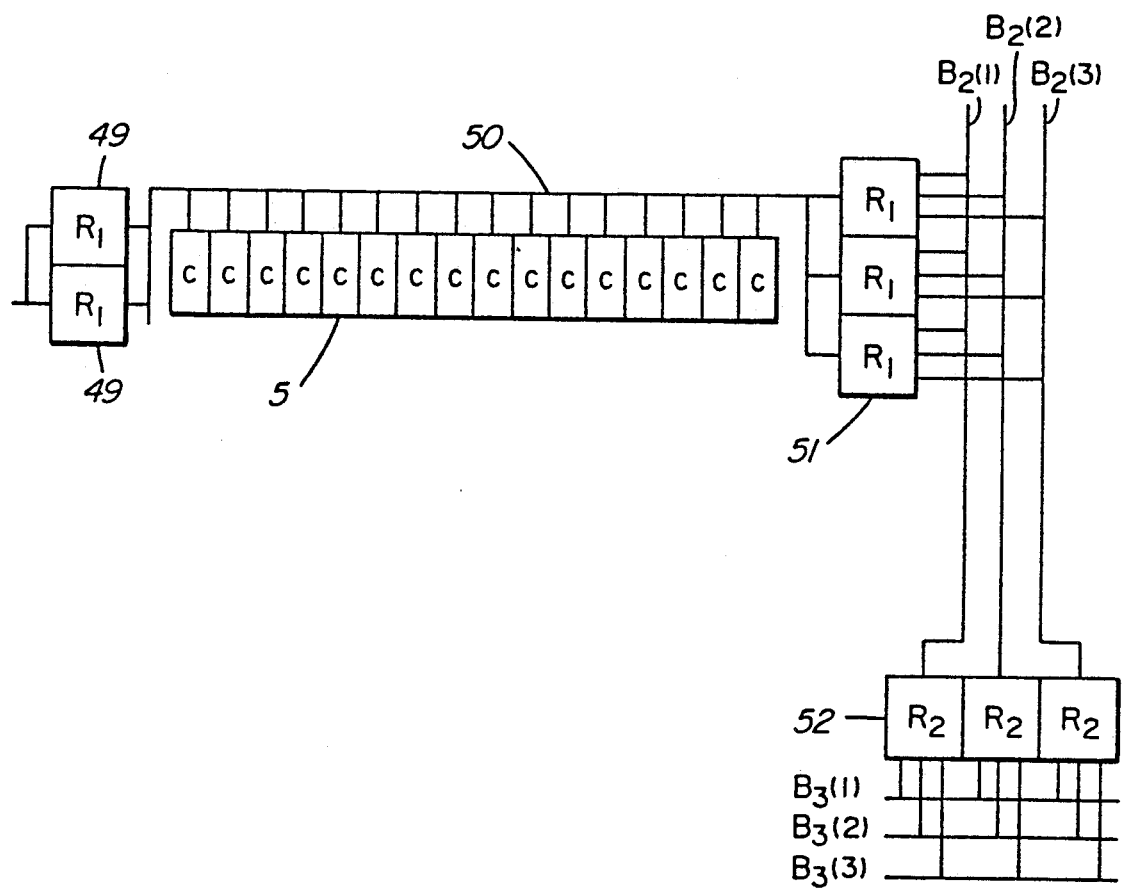
FIG. 10 is a schematic view illustrating a modification of the routers and buses used in the arrangement of FIG. 9.

A significant improvement to the second embodiment consists of replacing every individual router by two or more routers in parallel as shown in FIG. 10. With this improvement, no single router is by itself critical circuitry to any segment of any level. Therefore, since a large area is devoted to routers in a chip with 50 level 1 segments, replicating the routers significantly improves the yield. These routers in parallel are used in an associative manner exactly as were the computers in the level 1 segment. Thus not assigning a logical address to a router is sufficient to disable it. The necessity of assigning addresses to routers follows from the need to avoid the situation where two routers would try to duplicate the same message. Replicating routers is not just an overhead since it also increases their collective capability to buffer messages and they clearly provide a graceful degradation.

Another significant feature of the solution proposed in FIG. 10 is the fragmentation of all buses above level 1 in a number of independent sub-buses. Clearly, the width of buses can be adjusted as a function of the level to accommodate for the required extra bandwidth. Thus if 12 lines were sufficient to provide the required bandwidth, they could be partitioned in three independent sub-buses of 4 bits each without degradation of the actual bandwidth. Note that none of these sub-buses is critical and a defective sub-bus only results in a graceful degradation. If one over designs the bus system as a function of the expected number of defective sub-buses, the result is a low overhead high yield bus system. The selection of the optimum size of a sub-bus is beyond the scope of the invention but it clearly is dependent on the characteristics of the defect distribution and the design objective which may be to maximize the throughput or to minimize the latency.

This modification will be described in more detail by referring more particularly to FIG. 10 in conjunction with FIGS. 11 and 12. FIG. 10 shows a level 1 segment connected to the edge of the wafer by a pair of level 1 routers 49. These are shown as being connected in parallel. These two routers terminate a level 1 bus 50 to which a number of computers 5 are connected according to the usual organization. On the right side we also have three level 1 routers 51 connected in parallel, each of which can physically provide access to each of the three level 2 sub-buses called $B_2(1)$, $B_2(2)$ and $B_2(3)$. These three sub-buses are then routed vertically to three independent level 2 routers 52, each of which provides access to three independent level 3 sub-buses $B_3(1)$, $B_3(2)$ and $B_3(3)$.

Figure 11:
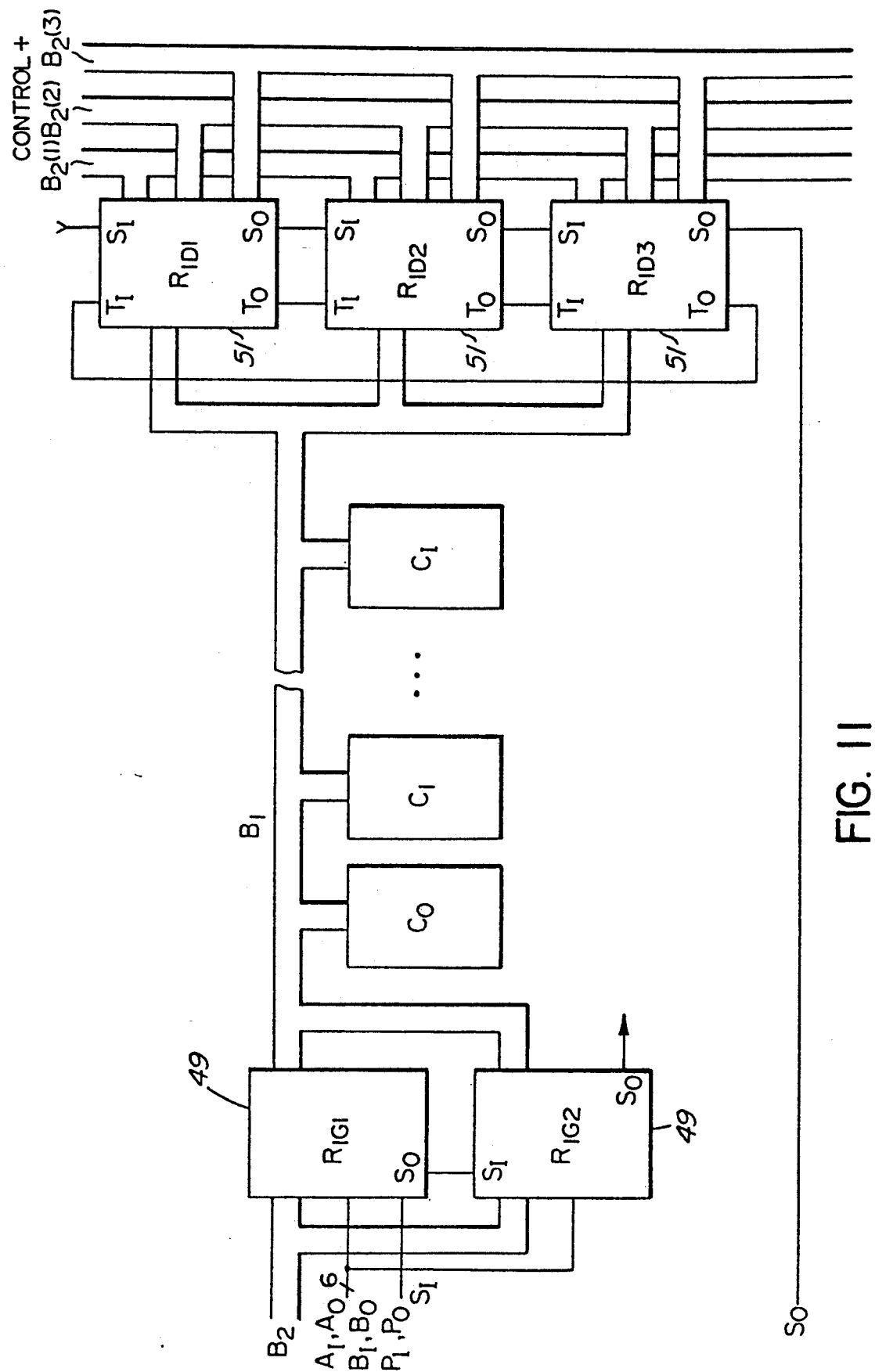
FIGS. 11 and 12 are expanded views of upper and lower portions, respectively, of FIG. 10.

An expanded view of the upper portion of FIG. 10, shown in FIG. 11, provides details on how the routers are physically connected. Note that significant details were omitted to limit the complexity of the drawing. The two routers 49 on the left ar completely connected in parallel except for the test and bootstrap scan chain which follows the usual arrangement. It then suffices for one of the two to be non-defective for obtaining a normal access to this level 1 segment. With the proposed router complexity, two defective routers is a very unlikely event unless defects are clustered in that region in which case the preferred strategy is to leave the segment out of the system instead of trying to provide more spares. On the right side, the three level 1 routers 51 are also connected in parallel but in a different manner. The three can be active provided that they are not defective and that it is possible to configure three complete level 2 sub-buses, which is not very probable, considering the total complexity of a level 2 sub-bus. During the test phase, the core computer would try to configure working sub-buses from the pool of available resources. If the wires in one sub-bus are defective, this sub-bus must be dropped from the configuration. For a complete sub-bus to be operational, one working level i router must be found for each segment kept into the configuration. The configuration procedure is of the same nature as the one discussed earlier but it is clearly more complicated. Note that each router must possess an interface to both the data portion and the control portion of each bus. If a router is finally not part of the bus, it must be transparent to the propagation of signals in the A, B and P-loops. Note that the delay on these loops is proportional to the router multiplicity in each segment and, because of that effect, one might prefer more elaborate schemes inspired from this simple scheme. Note that even if a router possesses the potential to connect to each sub-bus, its internal logic is only capable of communication to one bus on each side. A device capable of participating in two communications with two parallel sub-buses in parallel shall be considered to be 2 routers since it must duplicate most of the internal hardware. Connecting routers in parallel for parallel activity must adhere to the general rule that only one router can take a message. This explains the presence of the T scan chain ($T_I$ and $T_0$ signals) which manages yet another token that is one robust and simple technique to guarantee that only one will take care of an upward message. Note that fault tolerance in routers is confined to those routers connected in parallel to a common set of sub-buses. One alternate technique is to replicate complete independent sub-buses or group of sub-buses, which is simpler to implement, but much less robust as far as tolerance to defects is concerned. All sorts of hybrid schemes are possible and the discussion of their relative merits is beyond the scope of this document.

Figure 12:
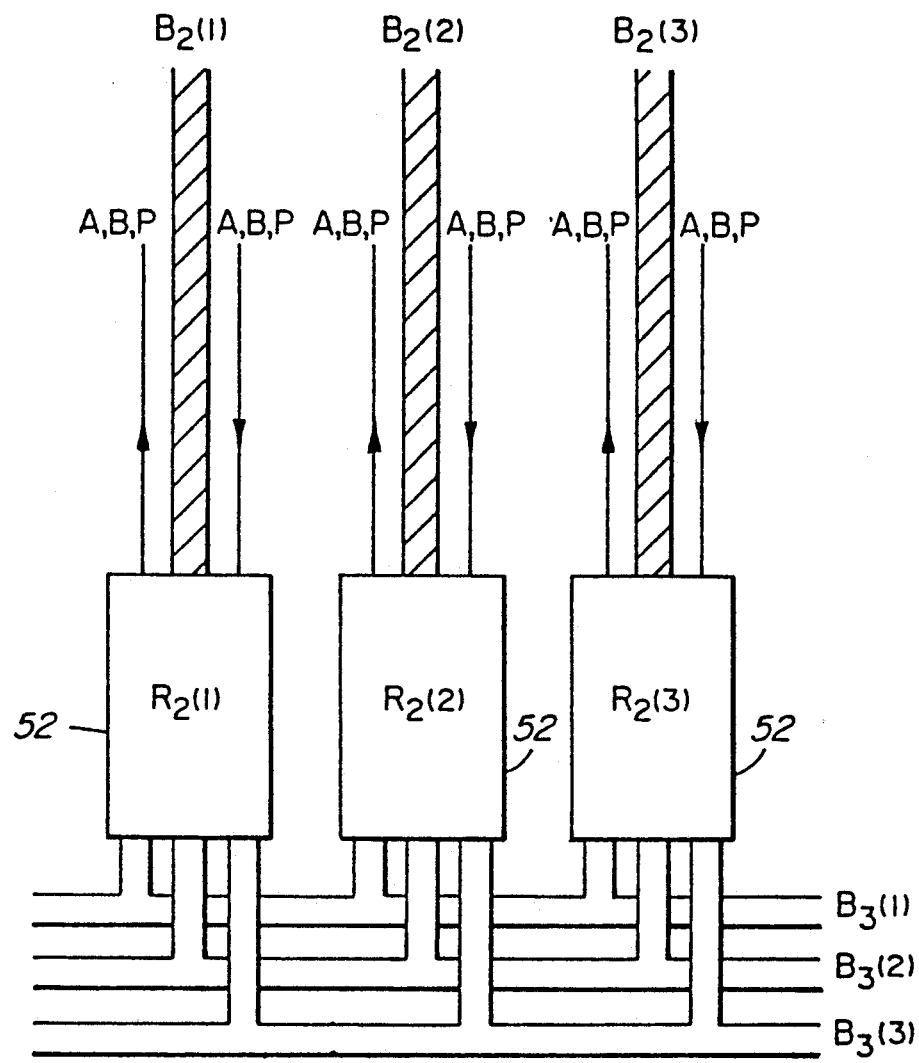

An expanded view of the lower portion of FIG. 10 is provided in FIG. 12. As shown in the FIG., the proposal consists of dedicating one level 2 router 52 to each level 2 sub-bus, each of which has access to the three level 3 sub-bus $B_3(1)$, $B_3(2)$ or $B_3(3)$. The interaction between the level 2 routers and the level 3 sub-buses is exactly the same as the interaction between the level 1 routers and the level 2 sub-buses (they are physically connected to three but they can only participate with one). The proposed embodiment ties each sub-bus to only one of the routers of the same level as the bus at one end of this bus. More sophisticated arrangements are possible, but on the one hand they are more costly to implement, and on the other hand, the yield of one router is fairly high. The necessity for redundancy in the lowest level routers connected to a bus follows form their potentially large number, which translates into a poor yield. Note also that routers of the lowest level are naturally reachable by the bus, whereas redundancy in the highest level routers would require a costly change of direction in the sub-buses.

FIGS. 13 to 18 show a three dimensional embedding with the improved hierarchical bus system where all buses are terminated by two routers to the higher level.

This embodiment is based on three components and one master block.

The components are the multicomputer chip the bus chip and the router chip.

The master block is again, a general purpose computer and there is no point to discuss it any further once we know it plays exactly the same role as the master block in the first embodiment.

Figure 13:
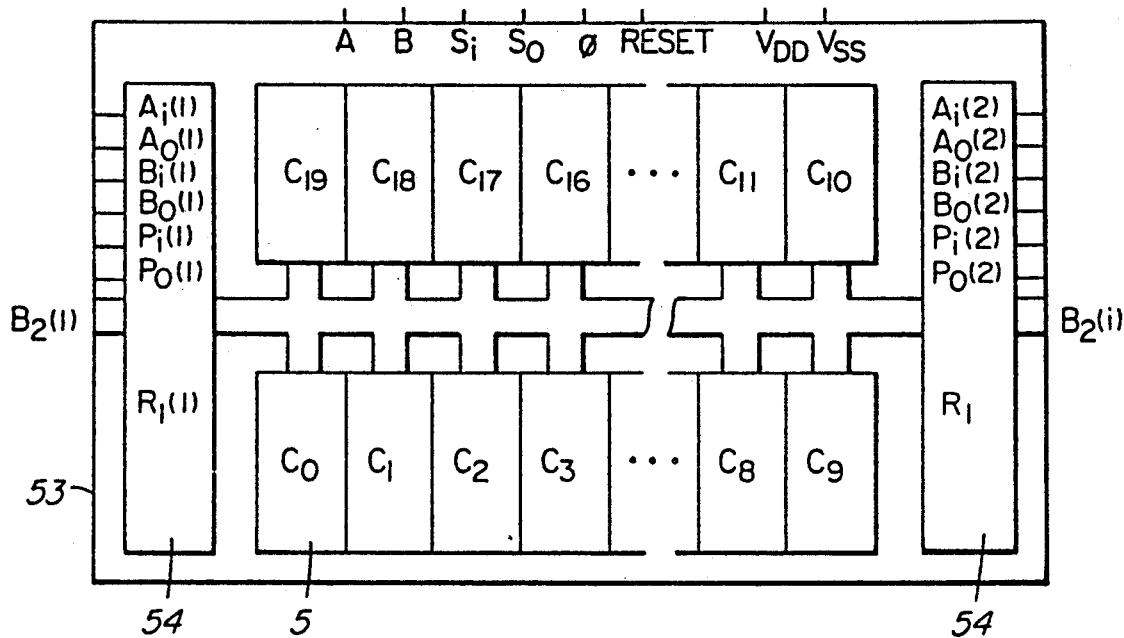
FIGS. 13 to 17 are schematic views illustrating different components of a three dimensional interconnection arrangement.

FIG. 13 shows the floor plan and block diagram of a multicomputer chip 53 with two level 1 routers 54 and 20 computers 5. Note that each additional router requires 14 additional pins.

Figure 14:
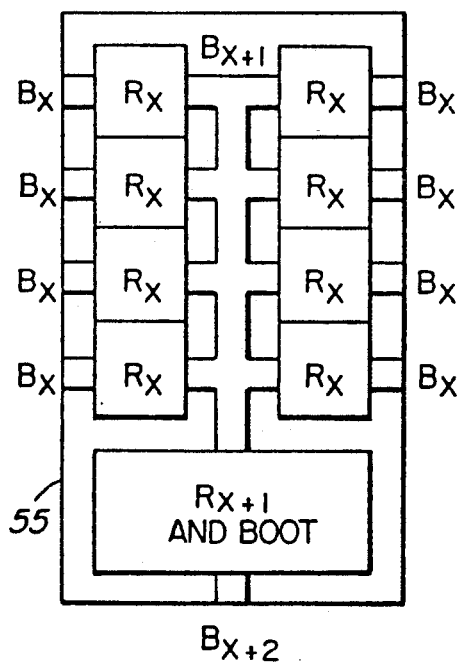

FIG. 14 is a floor plan and a block diagram of a bus chip 55 which can be used to implement the active portion of bus hierarchies. Moreover, it does contain one bus level on-chip. Since it is to be used as a component, we suggest that it is more appropriate to keep all buses with 8-bit data paths for simplicity. Some important details were not shown for clarity but the analogy with FIG. 8 is evident.

Figure 15:
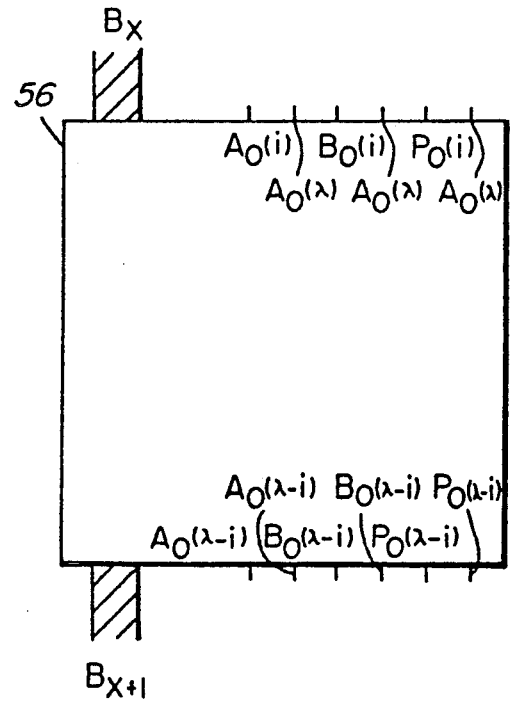

FIG. 15 is one single level X router packaged in one chip 56.

Figure 16:
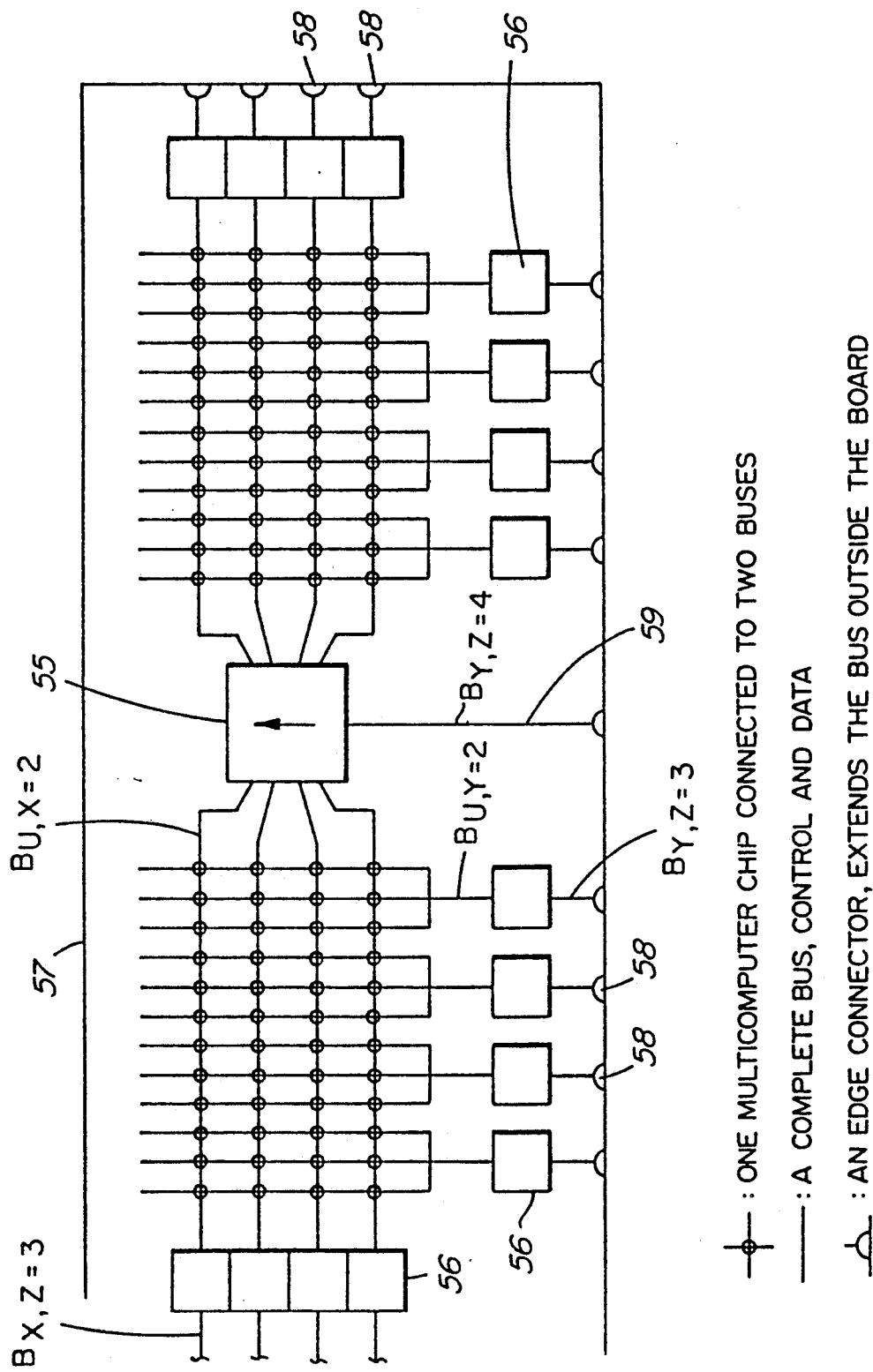

FIG. 16 is an improved processor board 57 which uses many multicomputer chips 53, router chips 56 and a bus chip 55. This board 57 takes advantage of the two routers available in each chip which can then participate in both U,X=2 and U,Y=2 bus sub-systems. This is accomplished by providing a chip at the intersection of each U,X=2 bus with a corresponding orthogonally arranged U,Y=2 bus and connecting one of the two routers to one of these two buses and the other router to the other of these two buses. (The U,X=2 bus is a level 2 bus in the X direction which interconnects level 1 on-chip U buses.) One bus chip is used to tie together the 8 U,X=2 buses. For convenience, we increased the number of chips per U,X=2 bus to 12 such that it became possible for us to organize the U,Y=2 buses into 8 groups of also 12 chips respecting the concept of barrier in the bus system to enable us to produce addresses for autorouting of messages. Note that the U,Y=2 bus is a very good practical example of a bus that is not laid out linearly. Since we intend to stack these boards, they have been terminated by router chips 56 and connectors 58 that will enable us to implement X,Z=3 buses and Y,Z=3 buses. The bus 59 coming out of the bus chip is also sent to an edge connector to enable us to build a Y,Z=4 bus sub-system. Note that the top side of the board is free. We do not elaborate in this direction, but it is clearly a good place to connect $R_2^*$ subsystem (FIG. 6 and FIG. 7) especially for dealing with high speed I/O channels. Let us stress that each board contains approximate)y 1700 working computers.

The main advantage with the new processor board of FIG. 16 over the basic board of FIG. 6 is the availability of two level 2 bus sub systems. Thus, unlike the basic board, the improved board does not use one single preferential direction for signal propagation but effectively provides 2 preferential directions. This feature eliminates the situation where two neighbouring chips must resort to a level 3 bus to communicate. In some applications, the increased flexibility of the bus system could effectively confine a large number of messages to one level below the one that would have been required with the simpler bus system of FIG. 6. The difference is significant when the multiplicity of the bus system increases by a factor of about 10 (8 in this case) for each reduction of 1 in the level. A larger multiplicity means a higher available bandwidth. It is stressed that the strategy of using redundant bus system was not only used in the level 2 bus subsystem but also on levels 3 and 4 for interboard communications. The purpose of the redundant bus system is to maximally exploit the possible locality.

Figure 17:
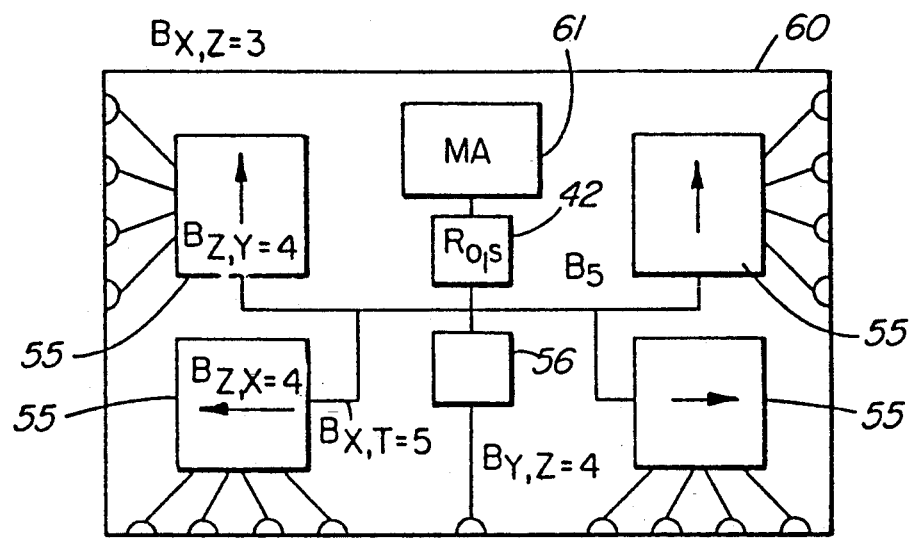

The bus system is completed by a top level bus and master board 60 symbolically sketched in FIG. 17. Four bus chips are needed to build this board. Note that the bus chips have purposely not been fully exploited. They have some unused lowest level inputs. The main motivation for these unused inputs is to keep regularity in dimension pairs which help to keep the system efficient when messages are auto-routed. Again the unused inputs could be reserved for entering the hierarchy one or two levels below the top, but if they are unused, the traffic on these buses is clearly reduced, and the desire to reduce the number of different components is a sufficient motivation to reuse the exact same chips.

Note also the obvious redundancy in level 4 of the bus system. Since all the possible addresses are reachable from the Y,Z=4 bus, a message passing there never has to go through the top level board. However this single level 4 bus can become congested, and the autorouting protocol would be constructed in such a way that a message only travels on the Y,Z=4 bus if it has to. When one of the 4 other level 4 buses can handle the message, it would automatically do so, the very top level 5 bus being reserved to communication with the master. Note that this bus system is very flexible since it supports assignment of independent problems to a subset of the hardware without any contention, however, when needed, the whole machine can be tightly integrated. Note also that an $R_{0,5}$ router 42 is needed to interconnect the master block 61 to the bus system.

Figure 18:
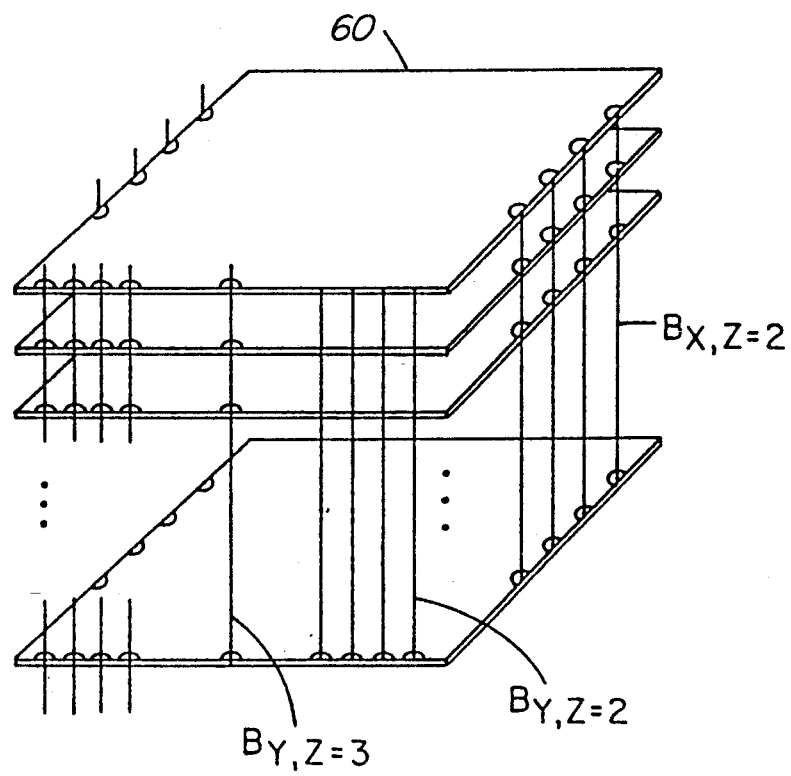
FIG. 18 is a schematic view illustrating how the three dimensional arrangement is achieved using the components of FIGS. 13 to 17.
Figure 19:
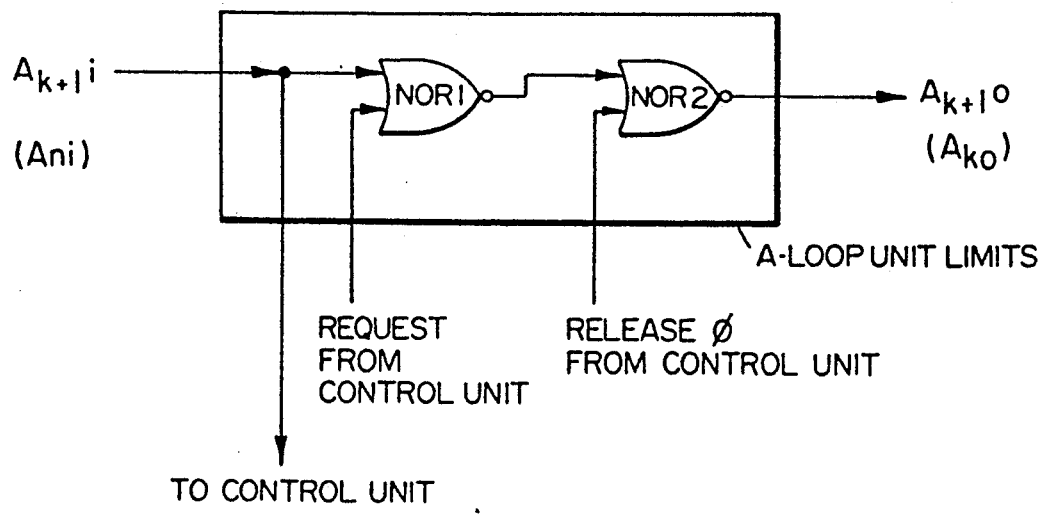
FIG. 19 illustrates schematically an A-loop circuit forming part of a router.
Figure 20:
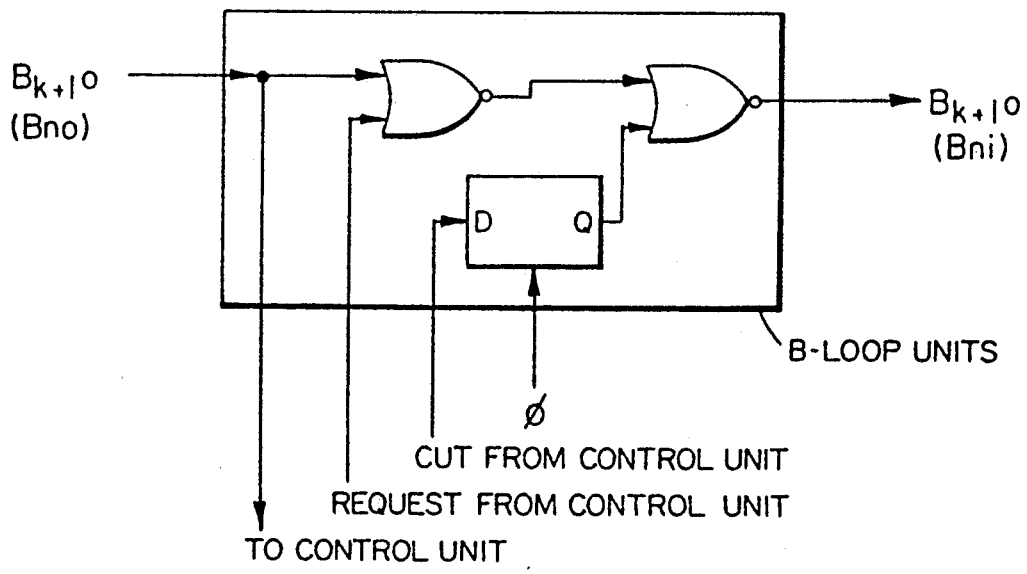
FIG. 20 illustrates schematically a B-loop circuit forming part of a router.

Finally, the proposed machine is composed of 11 boards, viz. 10 processing boards 57 and one top level bus and master board. Since compatible bus ports were brought to edge connectors in identical positions, these boards can be stacked as shown in FIG. 18 which is a high level sketch of the system. This figure clearly shows the compatible bus ports interconnected through flat cables and edge connectors. The complete system integrates 17000 complete 8-bit microcomputers, each of which possessing 8 kilobytes of RAM. A conservative figure for the throughput of one of these microcomputers is 5 million instructions per second. The aggregate peak performance of this machine is thus 85 giga operations per second with a usable physical memory of 136 megabytes.

We should stress that with this improved version of the hierarchical bus system there may exist many paths from a source to a destination computer. A suitable routing protocol leads to confining a large fraction of the messages to lower level buses, when working on problems which when mapped onto this machine respect the physical locality of individual computers. The large multiplicity of the lower level buses leads to dramatic increase in average bandwidth.

The operation of the routers will now be described in a more detailed manner with reference to FIGS. 19-24.

To understand how the routers operate we must first define the protocol used to construct messages.

1. A message is limited to 64 bytes including headers.
2. The first two bytes are the destination address.
3. The next byte is the remaining size of the message, including headers and protocol information but not counting the three first bytes.
4. If required by the application, the next two bytes are the address of the sender. This feature is not absolutely essential and according to the program it can be a smaller number of information bits identifying the sender if it is known for sure that the sender is the nearest neighbour.
5. Any suitable protocol information can also be transmitted as part of the two previous bytes or with additional bytes. There is a clear tradeoff between complexity and efficiency. For example, the master could broadcast new code through a range of addresses. This is easily implemented by reserving codes in the sender address field for that restricted usage.
6. The rest of the message is useful data.

In general, every individual communication proceeds according to the following pattern.

1. A router with a message to transmit takes a bus according to a token ring protocol that will be described later.

2. It broadcasts to all routers connected to the bus the destination address which is stored by all routers in the destination address register. All the routers compare their physical range of reachable computers that can be determined from the local logical address and the stored level, to the destination address of the message. One and only one router will match its range with the destination address. This is ensured by suitable selection of address assignment, proper masking of address bits as a function of the level and timely comparison between the received destination address with the local information through suitable logic.
3. The third byte is the size of the message which is stored in the size counter. If the size parameter is larger than the difference between in-count and out-count of the suitable buffer, the message cannot be accepted otherwise it is accepted.
4. The sender pauses on the bus for the receiver to ACK or NACK the message. ACK means that the receiver can accept a message and NACK means that the receiver buffer is too full. Following a NACK, the sender releases the bus and the message remains in the senders buffer for transmission at a later time. With this simple protocol, there exists a possibility for long messages to get systematically blocked. More complex protocols could remember such requests and reserve space into the buffer. (This is technically feasible but it is beyond the scope of this application.) A simple solution consists of having buffers a few times larger than the largest message which should prevent that problem from happening as long as the traffic is not excessive. Normally a stuck unrouted message will block the whole parallel computation and, at some point, the other sources will simply stop to emit messages waiting for a critical piece of data directly dependent on the blocked message. At this stage, the message can no longer be blocked.
5. Assuming an ACK, the rest of the message is transmitted and then the bus is released.

The access to all $B_K$ for $K>0$ is managed by a token ring protocol. Two rings are sufficient to resolve rapidly any contention and manage a simple priority allocation scheme. The A-loop illustrated in FIG. 19 reflects the presence of activity on the bus. The router which gained access to the bus owns it with the token for the time necessary to transmit its message. The transmission may either be successful or not successful if a NACK (not acknowledge) signal is received. The token owner releases the A-loop by pulsing its release input to the A-loop (Release AND 100 ). This effectively resets the A-loop which collectively behaves as a one bit latch. All the routers except the token owner keep their A-loop interface transparent by putting Request-Release=0 when some other router owns the bus. Observing A=0 signals to all routers the beginning of a new bus cycle. The A-loop can be released while the very last byte of the message is being transmitted, thus no time is lost for releasing the A-loop. A bus cycle is the time interval from one occurrence of A=0 on the A-loop to the next occurrence of A=0 on the same loop. Thus a bus cycle can last several clock cycles and the two should not be confused.

All routers with a message ready to deliver through a given bus try to access this bus on the next clock cycle which is dedicated to resolve contention to the bus. Trying to get the bus means inserting a request on both the A-loop and B-loop (Request=1) (see FIG. 20 for the B-loop interface). The B-loop is very similar to the A-loop except that the token owner breaks it. When the token owner is ready to release the B-loop, it breaks that loop (Cut=1). In some cases, the token owner may keep the bus. This is easily achieved by not releasing the B-loop (Cut=0). When there is no request from any router, both loops remain 0 and the bus cycle lasts one clock cycle, in which case the token owner keeps the token.

The presence of one or more request sets the A-loop and forces 1 on a portion of the B-loop. That portion of the B-loop forced to 1 by a request is exactly the remainder of the B-loop starting from the first router with a request after the token owner. Only one of the routers can both have $A_i=1$ and $B_i=0$. This router simply takes the bus on the next clock cycle and it becomes the new owner of the token. All other routers enter a listener mode where they listen to the message being transmitted on the bus to see whether the message is for them. Only the $R_{K+1}$ routers on $B_K$ are allowed to keep the token for more than one bus cycle. An $R_{K+1}$ router possesses a counter (not described in FIG. 22) which is set to a prescribed value when it first gets the bus. This value is decremented by one on every successful transmission. The $R_{K+1}$ router releases the bus on the first of the following eventualities:
1) There is no more message to transmit from the down buffer.
2) The count equals 0
3) The current message for $B_K$ is NACKed.

Clearly contention resolution can be collectively processed in one clock cycle of the system. If the propagation delay on the A-loop exceeds one clock cycle, the routers wait for the minimum number of clock cycle sufficient to complete the propagation of signals. This feature can be managed by yet another counter (not shown in FIGS. 21 and 22). The number of cycles can be hardwired or programmed during bootstrap. The latter eventuality is advantageous if one needs to program different delays for different hierarchical levels.

More elaborate contention resolution mechanisms are possible if one allows for additional hardware possibly in the form of an additional P-loop reserved exclusively for the propagation of the priority token. This can be useful but it is not mandatory.

The former loop interfaces for the A and B loops are based on the assumption that these loops can settle in one clock cycle. We discussed the loop operations in the case where more than one cycle is required but this is clearly an undesired overhead on the operation of the system. We will now show how these loop interfaces can be made much faster at a moderate hardware cost.

Figure 26:
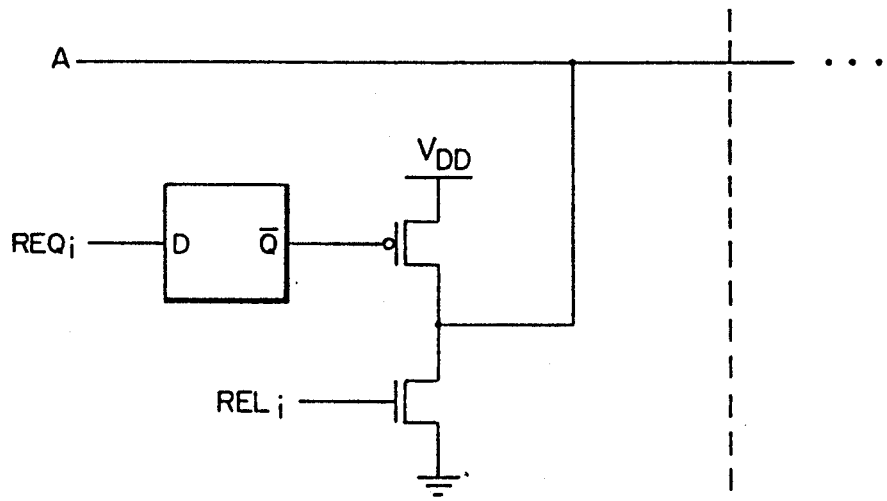
FIG. 26 illustrates schematically an A-line which can be used to replace the A-loop of FIG. 19.

Let us first begin with the A-loop interface. The purposes of the A-loop are to detect that one or more router needs the bus at the beginning of every bus cycle, and to signal to all routers the end of every bus cycle. The loop can be replaced by a single line as shown in FIG. 26. This line is pulsed to 0 by the token owner to signal the end of the current bus cycle. pulsing the $REL_i$ line for the last clock cycle of the current message does clear the A line. On the beginning of the next bus cycle, all routers with a message ready to transmit set their request latch by pulsing $REQ_1$. Observing 1 on the A line has the same meaning as observing 1 on the previous A-loop. All routers which do not get the bus must reset their request latch in the A interface. Only the one which gets the bus keeps its request latch active. Thus the token owner is responsible for holding the common A line for the entire bus cycle. The current A interface fully takes advantage of the ability to do dynamic logic with MOS technologies; however its function can be emulated with other technologies.

One should note that the number of input output signals has been reduced from two for the former A-loop to a single one for the current A interface. This new A interface is more costly because the two transistors that were added could become much larger than they needed to be with the A-loop. The main advantage of the new A interfaces follows from the fact that they all drive directly the same line, thus they are not daisy-chained and their intrinsic delays are not added. The advantage can become very important if a large number of routers—say 40—share the same bus or when the former A-loop must propagate off-chip as in FIG. 6 for example. The current A interface capitalizes on the well known fact that even though the load on the A line can become large, buffers of gradually increasing size can be devised to drive this line with a delay proportional to the logarithm of its capacitance. If the large delay on the A-loop is due mainly to speed of light propagation delays, the current proposal could actually degrade the speed of the A interface. Thus the two solutions are useful and the selection between them is a relatively straightforward engineering problem after the details of the bus implementation have been devised.

Figure 27:
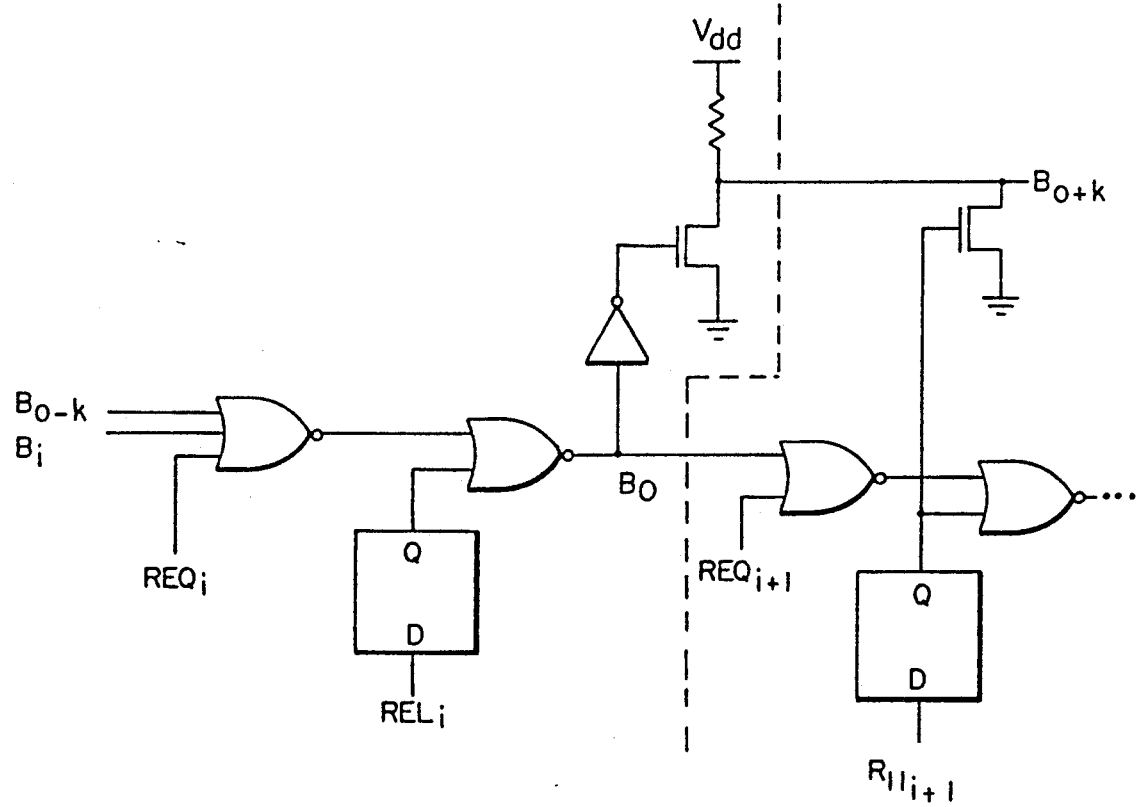
FIG. 27 illustrates schematically a modification of the B-loop of FIG. 20.

The B-loop interface must stay a loop; however its operation can be substantially improved when the resolution of contention conflicts requires several clock cycles. This improvement comes at the cost of some additional hardware. The basic idea of the improved B-loop is that it can settle much faster if some of its $B_o$ output signals are allowed to jump over several router interfaces. This function is achieved by the $B_{i-k}$ and $B_{o+k}$ signals. Two versions of the B-loop interface are required as shown in FIG. 27.

The right-most B-loop interface, which is the normal B-loop interface, is almost like the conventional one, except that it also has the ability to break the bypass route to make sure that it can effectively break the B-loop when it is the token owner. The bypass route is labelled $B_{o+k}$ in the figure. When several normal B-loop interfaces can be bypassed by the $B_{o+k}$ signal, they are all connected in parallel to that signal and they all have the ability to force it to 0.

In the left-most portion of the B-loop interface, a second input was added for the $B_{i-k}$ signal. This $B_{i-k}$ input is to be connected to the $B_{o+k}$ outputs of the k routers on its left. This second input has a function similar to the $B_i$ input, namely the propagation of a 1 on the B-loop. However when the set signal originates from a distance greater than $k-1$, it is received much faster if $k-1$ routers are skipped. The new B-loop is thus composed of a mixture of the two types of interfaces, for every $k-1$ normal interface, one interface with the skip input is inserted. In practice, k is a parameter dictated by the context but a reasonable value is $k=8$. Note that the interfaces with the skip inputs are all connected directly and they form a short loop containing k times fewer routers. Thus, a loop composed of a large number of routers could be almost k times faster than the basic B-loop. Note that the loop is only faster when it is being set and it is not faster than before when it is reset.

The routers with the skip input require one additional input and one additional output, whereas the normal routers only require one additional output. A more complex B-loop with a parallel reset is possible; however, since the reset of the loop can be anticipated several clock cycles before the beginning of the bus cycle, without modifying the essence of the B-loop operation, the fast-set is sufficient to achieve the desired speed gain. Indeed, the improved A-interface can be reset much faster than the B-loop without parallel reset; however, it is the release of the A-interface and not of the B-loop which indicates the beginning of a new bus cycle.

LEVEL 0 ROUTER

A level 0 router is designed to interface with a level 0 bus which is a conventional microcomputer bus. The router is like an address-based peripheral input-output adapter. Thus it lies within the address space of the microcomputer which basically sees three addresses, namely the base address of the status register, the up-buffer and the down-buffer. Since more than 8 bits of status are required, more than one address can be reserved to access the status register.

Figure 21:
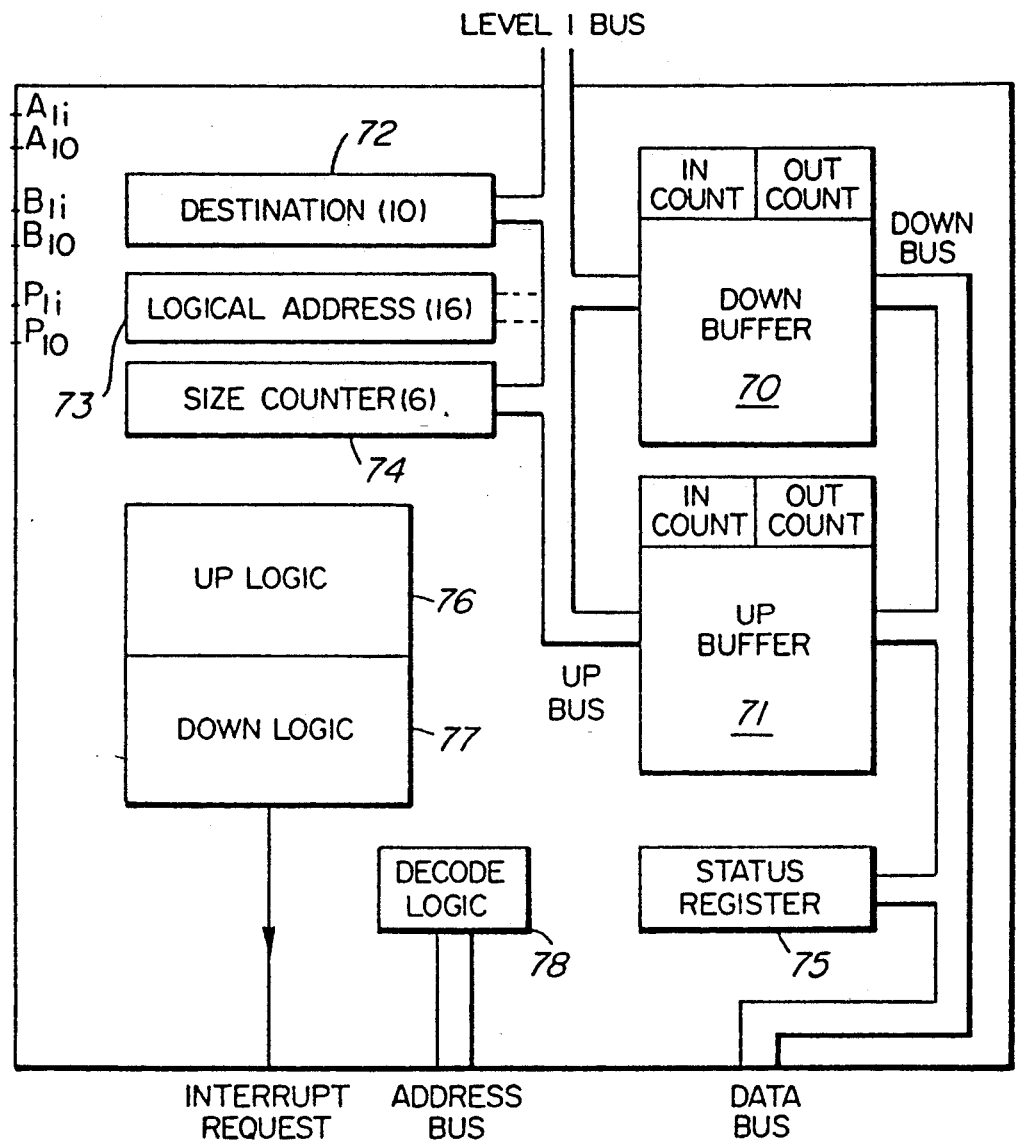
FIG. 21 is a block diagram illustrating the principal components of a level 0 router.

As shown in FIG. 21, the router contains two buffers which are implemented as two dual port register files. Just for the sake of being specific, the down buffer 70 can contain 128 bytes and the up-buffer 71 can contain 64 bytes. Each buffer is written to its in-count address and is read from its out-count address. These counters are incremented each time a data is read or written. The difference between the two counts reflects the size of the messages in the buffers. When the out-count is larger than the in-count, it means that the in-count has made an overflow (the buffer is wrapping around) in which case the in-count must be completed by a 1 in the first digit outside the range of the counter to calculate the number of bytes actually in the buffers. When the two counts are equal, the buffer is either empty or completely full. An additional status bit is needed to differentiate the two cases. With dual ports, a message can be received by the router at the same time that a second is being transmitted.

The router also possesses a destination register 72 (16 bits) and a logical address register 73 (16 bits). The logical address of a level 0 router is the logical address of the associated microcomputer. The router also possesses a size counter (6 bits) 74 where the size of a message is initially stored. This value is to be compared with the difference between the out-count and the in-count suitably adjusted for wrap-around to decide whether an incoming message can be accepted. A level 0 router answers only when the received destination address matches its logical address. Assigning an unused logical address literally cuts out a computer of the system which is how we take care of defective computers.

It is possible to replace the 16-bit destination register 72 by a one-bit comparison result flag register for storing the difference between the received destination address and the stored logical address. With a one bit flag, the comparison must be made on the fly while the two first bytes of a message get in. In the simplest variant of the router, this is a little cheaper to implement, however, some more elaborate and potentially useful features of the router could make the use of the complete destination address preferable. The two solutions shall be considered as logically equivalent feasible alternatives.

Two cases will now be considered, a message was received by the level 0 router or a message is to be sent out through the level 0 router.

Case 1: Incoming message

1) The router receives a message which matches its logical address.
2) The difference between the in-count and out-count is such that enough space is available to buffer the incoming message. Recall that the third received byte is the size of the message. Then the ACK answer is sent and the rest of the message is accepted. The size counter 74 is suitably decremented and when the count reaches 0, the router knows that the message is finished. The received address can be stored into the buffer in parallel with its storage into the destination register 72 and the size count can also be stored into the buffer in parallel to being stored into the size counter 74.
3) In the case where insufficient space is available NACK is emitted. Two cases should be considered: there is less than three available bytes in the buffer:
   in this case, the header of the message is not stored in the buffer and in-count is temporarily frozen;
   there are three or more available bytes in the buffer;
   in this case, the three first bytes of the message were stored before a decision could be made on the ability of the buffer to accept the complete message, thus in addition to sending NACK, in-count must be reduced by three.
4) A completed message generates an interrupt to the computer and increases the received-messages count in the status register.
5) When the interrupt is finally processed by the computer, it reads the status register 75 where it finds the number of complete messages in the down-buffer 70.
6) The computer then reads the content of the down-buffer 70 located at a predetermined value in its physical address space.
7) The out-count is automatically incremented to reflect where is located the next piece of information of the current message. The difference between in-count and out-count reflects the actual empty space into the buffer.

Case 2: Outgoing message

1) The processor has assembled a message to transmit in accordance with the protocol.
2) It addresses the status register 75 which contains the current difference between the in-count and the out-count of the up-buffer.
3) If there is not enough space, the computer waits.
4) If there is enough space, it simply writes at the physical address where the up-buffer 71 was mapped in its own address space. The in-count is automatically incremented to generate a valid internal router address for the next piece of data to be written into the buffer by the computer, always into the same address in its own address space. When the message is completely in the up-buffer 71, the computer writes one bit into the status register 75 which increases the count of outgoing messages by one.
5) If the count of outgoing messages is greater than 0, the router starts to fight for the bus.
6) As soon as it gets the bus, it tries to transmit this message to a suitable destination on the bus. If a NACK is received, the message is temporarily blocked into the up-buffer. In this case, the router will continue to try to obtain the bus. By the nature of the protocol, the destination with a buffer that currently has insufficient space is also actively trying to empty its buffer.

The router also includes an UP LOGIC block 76 which contains all the circuitry related to the management of the UP Buffer 71 and of the $B_{K+1}$ bus and a DOWN LOGIC block 77 which contains all the circuitry related to the management of the DOWN BUFFER 70 and the $B_K$ bus. A Decode LOGIC block 78 receives and interprets the addresses sent on the address portion of the $B_0$ bus.

ALL OTHER ROUTERS

Figure 22:
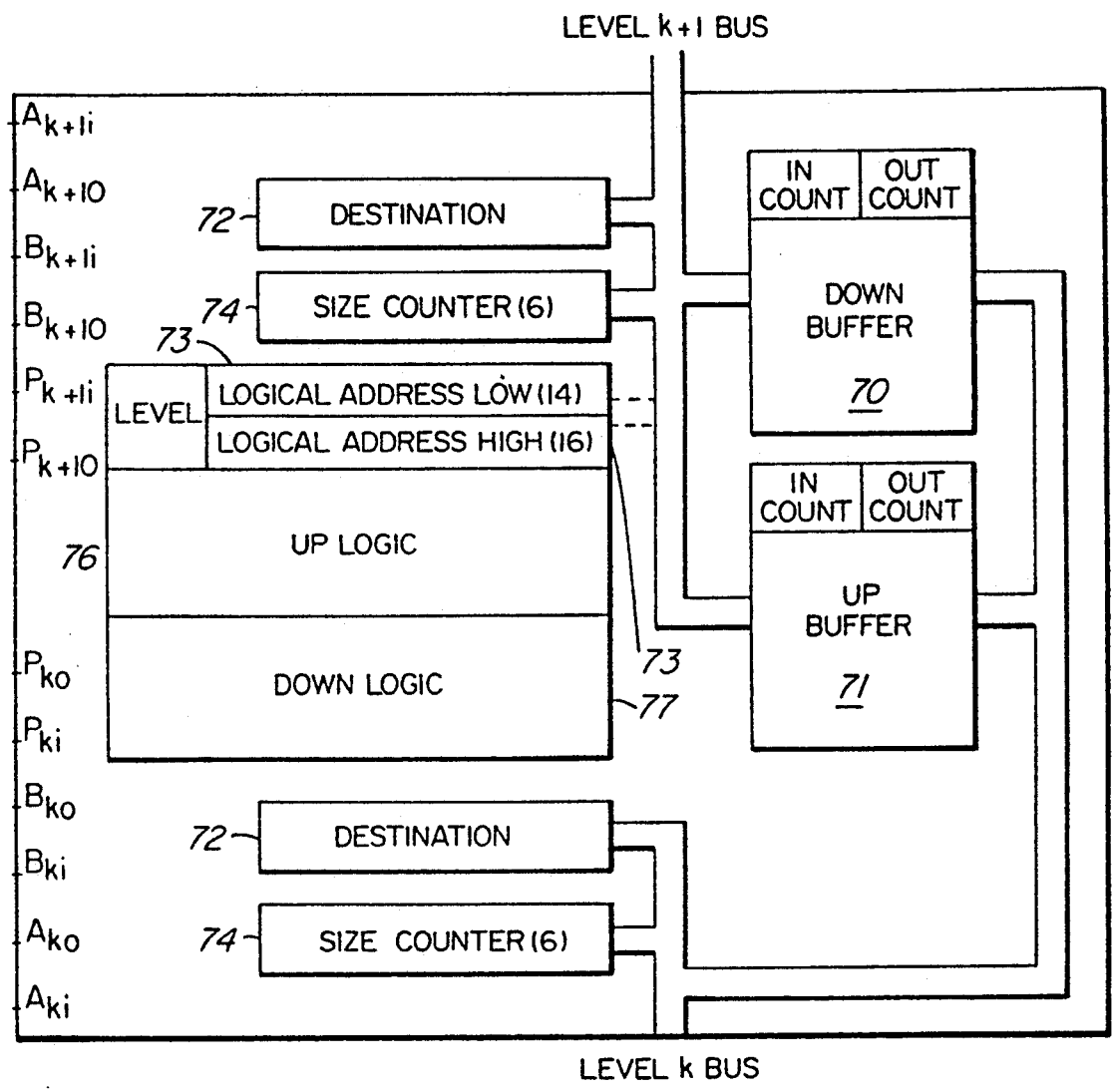
FIG. 22 is a block diagram illustrating the principal components of a router of level 1 or higher.

All routers above level 0 are almost symmetrical with respect to buses of level K and level K+1. Instead of interfacing to a level 0 bus, this module must interface to two buses of level above 0 which operate in an almost identical manner. Thus, such routers possess, as seen in FIG. 22, two destination registers 72, two size counters 74 and again one up-buffer 71 and one down-buffer 70 managed in a way very similar to how a level 0 router deals with a level 1 bus. Clearly a router possesses all the circuitry to respond simultaneously to one upgoing message and one downgoing message. It also possesses twice the A, B loop circuitry since it participates to the activity on two independent buses. The proposed size of the two buffers is 128 bytes.

A significant difference between the $R_K$ router ($K>1$) and the $R_O$ router is that the former possesses two logical addresses which define the range of reachable destinations. Note that $R_O$ is really a particular case of $R_K$ on that matter, since for $R_O$ the range is limited to one address. When the $R_K$ router receives a destination address from the $B_{K+1}$ bus, a match occurs if the received destination falls within the range defined by the pair of addresses. The pair of addresses assigned to a router must thus correspond to the actual range of addresses reachable through its $B_K$. When the destination address received from $B_K$ falls outside the range defined by the pair of addresses, $R_K$ knows that none of its sons in the hierarchy is capable of routing the message. This criterion thus defines a match for comparison of addresses in the interaction between $R_K$ and $B_K$. The dotted lines between $B_{K+1}$ and the logical address registers 73 indicate that a path exists for setting those addresses during the bootstrap phase. In the simplest envisioned system, these addresses do not change during normal operation.

Using the new definition of a match between destination and logical addresses, the above description for case 1 point 1, 2 and 3 apply directly to the process of receiving a message, whereas case 2 point 5 and 6 apply directly to the process of transmitting a message, irrespective of where the mess age is received from or transmitted to. We shall stress again the ability of the routers to deal with independent and possibly simultaneous activities happening on both $B_K$ and $B_{K+1}$. Each bus is clearly managed collectively by all routers connected to it and only the routers directly connected to a bus affect its operation.

CONGESTION OF BUSES

The protocol works under any load condition, but if the load is too heavy, the performance of the bus system can actually decrease due to repeated requests to a congested buffer. The bias of access priorities in all buses in favour of highest level routers connected to them is on effective means to limit wasted time due to congested buffers. Since the bandwidth is reduced toward the highest levels of the bus system, congestion will always happen with some classes of operation which rely on a massive amount of long distance communication. However, the highest level buses which are the real bottleneck will be used most effectively, while the possible wasted time due to congestion of lowest level buses will not be significant since the highest level buses are not designed to be capable of dealing with the traffic that all the lowest level buses can potentially generate. More elaborate strategies can obviously be implemented to reduce the effects of anticipated congestion, but in a first embodiment we shall be satisfied with the simplest method.

ASSIGNMENT OF LOGICAL ADDRESSES

The preceding discussion of the routers assumes that there exists a means to assign logical addresses usable for autorouting of messages. Moreover, some assignments could result in a functional machine that would offer a poor performance.

The only mandatory requirement for assignment of addresses is that disjoint segments of the machine be assigned disjoint logical address intervals. Recall that a level K segment is all structures and modules below a level K bus. Assigning consecutive addresses to working neighbour computers in a level 1 segment is one way to respect the mandatory requirement. The range of addresses assigned to one level 1 segment begins at one more than where the immediate level 1 neighbour segment ends. At some point the immediate neiqhbour must be inferred from the physical structure of the bus, contiguous ranges of addresses being assigned to $R_K$ routers connected to a $B_K$ bus; the lowest level address assignment being consistent with the highest level.

This method of assigning addresses is completely transparent to the programmer and functionally emulates global redundancy. In other words, it is not important to know which computer is defective, if 96 chips contain 1700 working computers, a functional system with exactly 1700 computers can be configured.

This simple method shall not be our preferred means of assigning logical addresses because a computer with a logical address that differs only by one unit can be located very far away. This means that apparently mundane messages to nearest neiqhbour could require transmission over the top level bus which would thus rapidly become an unacceptable bottleneck. The programmer or the compiler would have no means of knowing how the task will map on the physical machine. This is a high price to pay for functional globality of sparing throughout the machine.

We shall explain the preferred method for the basic embodiment. (FIG. 6) That same method is applicable to all embodiments: it is only a little more complicated.

The basic strategy is as follows: when some barrier must be crossed, this fact must be reflected in how logical addresses are generated by changing one bit carrying a weight more significant than if the barrier had not been crossed. The logical addresses reflect both the physical and the hierarchical distance between two elementary computers. The hierarchical distance is measured by how high a message must go in the hierarchy of buses in order to reach its destination.

In a two dimensional machine, three fields are sufficient to constitute the logical address. These fields are respectively:

U field: logical number assigned to a good computer in one chip

Figure 23:
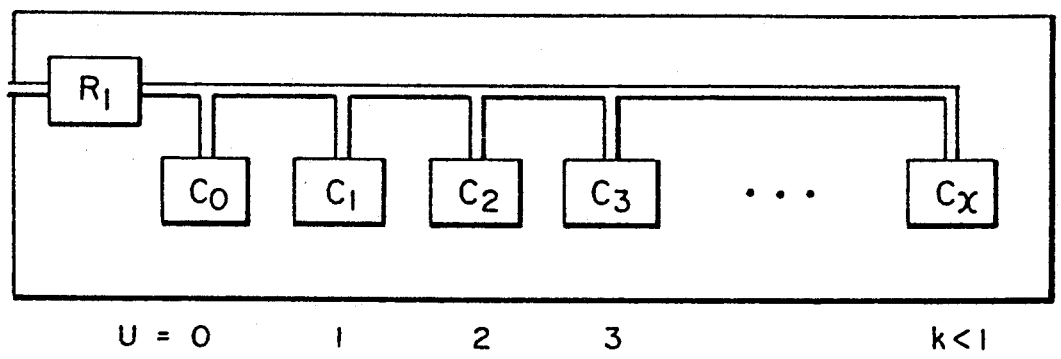
FIGS. 23 and 24, based on FIGS. 1 and 6, respectively, illustrate how logical addresses may be formed
Figure 24:
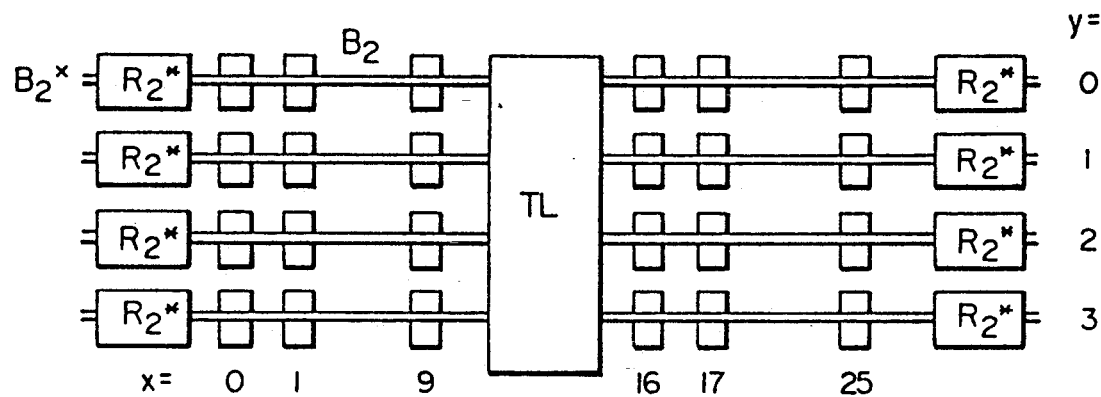

X field: physical address of a chip in the X dimension
Y field: physical address in the Y dimension A logical address is formed by the concatenation of the Y, X and U fields. A possible assignment is shown in FIGS. 23 and 24.

If two logical addresses only differ by their U address, clearly the destination is in the same chip and the level 1 router which was assigned addresses covering the adequate range knows for sure it must not take this message, the destination shall be one of the active on-chip computers which, by construction, will always receive the message. If there are 20 computers they are assigned addresses in the range 0 to 19 which requires 5 bits, we shall not be concerned with unassigned logical addresses as long as the programmers know that a certain range of U address does not exist and they generate code accordingly. The U field is thus treated as the 5 least significant bits of the logical address.

If a communication is to be sent to a computer reachable through a level 2 bus, the Y address will be the same but the X address will differ. Note that some X addresses are not reachable without resorting to a level 3 bus. We made this fact easily detectable by creating a difference in a bit of the address more significant than those bits required to describe the range which is accessible by a given level 2 bus. Referring to FIG. 24, it is why X addresses from 10 to 15 inclusively were left unassigned (recall that there are 10 chips per level 2 bus). When a bit of weight greater than or equal to 16 differs in the X address, the level 2 router in the top level block knows for sure that it must catch the message since it falls outside the range defined by the pair of logical addresses. Any difference in the Y address implies a transfer through the level 3 bus and thus any difference in the Y field is treated as most significant.

It should he clear that if the first address assignment strategy was used on subsets of the machine larger than a chip, but still confined within some region —say a level 2 segment for example —defect tolerance (sparing) would be global in that region. This hybrid approach brings most of the yield enhancement benefits associated with true global sparing without jamming buses above level 2 with unnecessary messages. In an application where the available bandwidth on level 2 buses is not completely used, the hybrid approach yields a straight production cost reduction.

When there are more than one $R_K$ per $B_K$, as a general rule, most significant differences must always be resolved first otherwise some efforts are wasted. When two differences have equal weights, either one but not both can take the message. The simplest solution is thus to assume that, if there is equality, one of the routers always takes the message. More elaborate schemes are also feasible and yield a better spreading of the communication load under heavy traffic conditions.

Logical address combinations not assigned a private addresses could be reserved for group addressing or for global addressing provided that the routers of all levels are equipped with the appropriate decoding logic.

In a three dimensional arrangement, a Z field would also be included in the logical address. Finally a useful concept in more complex embodiments where more than one router can take a message is the concept of dimension pairs. In addition to knowing its level, a router should know to which dimension pair it is associated. For example, the $R_K$ routers in the TL block in FIG. 6 are X-Y routers. In reference to a router, the first letter refers to the lowest level dimension whereas the second refers to the highest level dimension. In reference to a bus the second letter defines the dimension of the current bus and the first the dimension of the bus one level below. This assumes that there exist routers between these dimensions.

For example, it is possible that the X, Y and Z addresses of a source and destination computers differ in such a way that there exist a level 3 difference in Z and a level 2 difference in Y. Assume level 2 U-x, level 3 x-Z and level 2 U-Y bus subsystems exist, but a level 3 Y-Z bus subsystem does not exist. The message will automatically be sent through a U-X level 2 bus to reach its level 3 X-Z bus simply because of the more significant weight difference in the Z dimension. If no X-Z level 3 bus exists, but a level 4 Y-Z bus exists, the message will follow the X level 2, Y level 3, Z level 4 bus route. This discussion shows that the routers must know about the environment to react properly, but also a suitable distributed automatic routing algorithm can always be implemented.

Figure 28A:
FIGS. 28A, B and C illustrate different types of bus.

In the description of the preferred embodiments of the invention the buses of the hierarchical bus system are individually conventional buses in that each is composed of a plurality of electrical conductors. However, it is envisioned that buses other than the conventional type could be adapted to the hierarchical approach provided by the invention. For example the ZMOB system described in IEEE Transactions on Computers Vol. C-31, No. Oct. 11, 1982 entitled "Image processing on ZMOB" by Kushner et al, involves the use of a fast cyclic shift-register bus known as a conveyor belt. This conveyor belt could readily be adapted to the hierarchical approach taught by the invention. The notion that buses other than the conventional type can be used with the present invention will be clarified with reference to FIGS. 28A, B and C and FIGS. 29A and B.

Figure 28B:
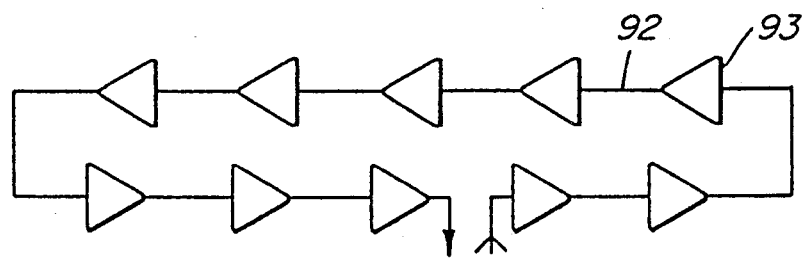
Figure 28C:
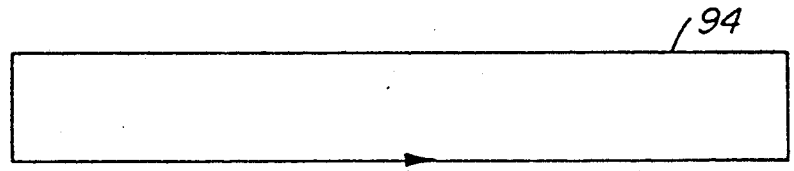

Generally speaking, a bus is a communication medium shared by a plurality of modules that need to communicate. They need not be connected in parallel to a single line 90 as in FIG. 28A. An alternate implementation of a bus is the loop-bus where a loop 92, as shown in FIG. 28B, passes through all the modules (routers) that need to communicate over the bus. Note that in the loop-bus, all routers possess an amplifier 93 used as an active repeater and also they are capable of breaking the loop-bus when they have to transmit, provided that they were first granted permission to do so. A symbolic representation 94 of the loop-bus is shown in FIG. 28C.

Figure 29A:
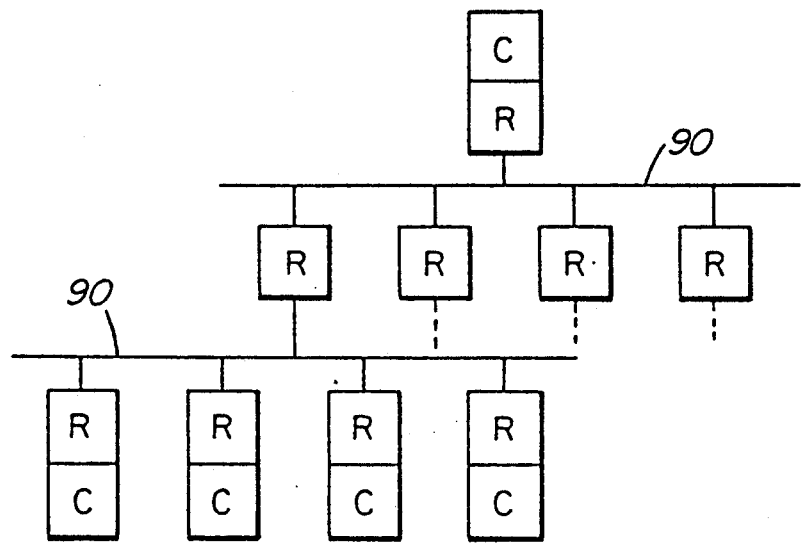
FIGS. 29A and B illustrate the hierarchical bus system using a conventional bus and a loop bus.
Figure 29B:
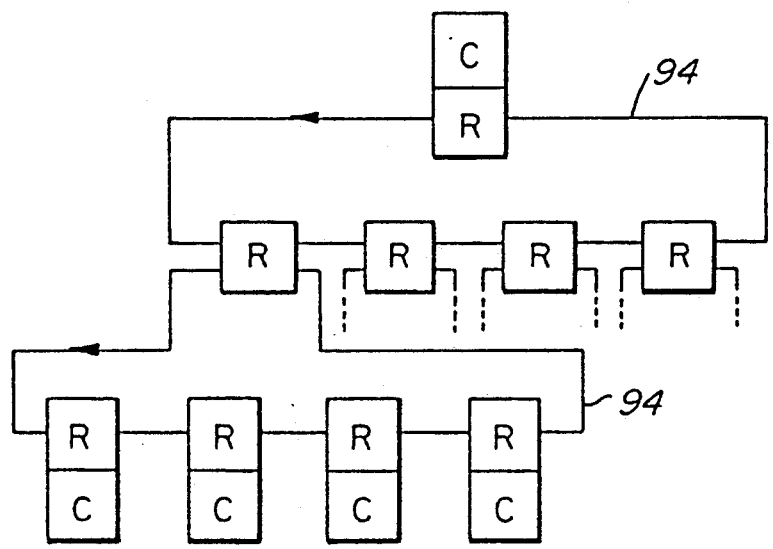

FIGS. 29A and B demonstrate the extent to which a conventional bus and a loop-bus can replace each other. A symbolic representation of a small machine using a conventional hierarchical bus system is shown in FIG. 29A. In FIG. 29B, a functional equivalent based on the loop-bus is shown. It shall then be clear that a loop-bus can replace a conventional bus in all the embodiments described so far.

The negative aspect to the use of a loop-bus is an increase of the number of communication signals. Each wire of the conventional bus is replaced by two. However, there are also positive aspects to the use of the loop bus: if an ECL or GaAs technology is used to implement the routers, a dramatic increase of the transmission rate is possible. With current semiconductor technology, it is not unthinkable to transmit at more than one gigabit per second on each line of the loop-bus. Thus, a smaller number of lines in the loop-bus could actually provide a higher performance than a larger number of lines in a conventional bus.

Several variations of the loop-bus are possible. The following list is representative of the range of possibilities:

a loop-bus with single-ended not terminated buffers;
a loop-bus with single-ended terminated buffers;
a loop-bus with double-ended terminated buffers;
a loop-bus with latched buffer also referred to by some authors as a conveyor belt bus (see above);
a loop-bus where off-chip signals are propagated on transmission lines;
a loop-bus where the buffers are implemented in any suitable technology, CMOS, ECL or GaAs;
a loop-bus where the transmission medium is optical and where the source is a light emitting device and where the receptor is a suitable light detector.

Accordingly, as used in the claims hereinafter, the expression "bus" will be understood to encompass any communication medium shared by multiple processing devices, more particularly computers.

I claim:

1. A semiconductor die structure comprising:
   a plurality of individual microcomputers formed on a semiconductor die, said plurality of individual microcomputers connected in parallel to a first bus on the semiconductor die, each of said plurality of individual microcomputers comprising an internal bus and a microprocessor, a memory and a first router connected to said internal bus, said first router having a single data link for interconnecting said internal bus to said first bus only;
   a second router formed on the semiconductor die, said second router connected to said first bus and having means for connecting to a bus external of the semiconductor die, the external bus having additional components connected thereto, wherein said plurality of individual microcomputers are selectively interconnected to the additional components via said second router; and,
   means provided on said first bus for resolving access conflicts between said plurality of individual microcomputers;
   in which any defective individual microcomputer can be assigned an unused logical address to render that microcomputer inactive;
   and in which a test scan chain is provided on the die, the test scan chain passing through every router on the die to enable testing and bootstrapping of the individual microcomputers.

2. A microcomputer die structure according to claim 1 in which two second routers are connected to the first bus at spaced locations and adjacent an edge of the die.

3. A microcomputer die structure according to claim 1 in which at least two identical, independent second routers are connected in parallel to each other at an end of the first bus.

4. A microcomputer die structure according to claim 1 in which the means for resolving conflicts comprises a first loop passing through all the first routers and indicating the presence of activity on the first bus and a second loop passing through all the first routers for assigning access priorities.

5. A microcomputer die structure according to claim 1 in which the means for resolving conflicts comprises a line passing through all the first routers and indicating the presence of activity on the first bus and a loop for assigning access priorities, the loop having a first path passing through all the first routers and a second path passing through some of the first routers.

6. A microcomputer die structure according to claim 1 in which each first router comprises two dual port buffers, conductor means connecting one port from each buffer to an input for a bus and connecting the other port from each buffer to an input for another bus.

7. A microcomputer die structure according to claim 1 in which the second router is adjacent an edge of the die.

8. A semiconductor chip comprising a semiconductor die structure according to claim 7 packaged as a chip.

9. A microcomputer die structure according to claim 1 in which the test scan chain defines a first state in which a first router contained in a microcomputer is transparent, a second state in which the first router can receive a test signal, a third state in which the first router can receive a logical address and a fourth state in which the first router is inactive.

10. A semiconductor die structure according to claim 9 in which, for bootstrapping, the test scan chain progresses in turn through the first routers by changing the state of each first router to the third state followed by the first state, whereby each router can receive a logical address and then becomes transparent to allow the subsequent first router to receive a logical address.

11. A semiconductor die structure comprising:
a plurality of individual microcomputers formed on a semiconductor die, said plurality of individual microcomputers connected in parallel to a first bus on the semiconductor die, each of said plurality of individual microcomputers comprising an internal bus and a microprocessor, a memory and a first router connected to said internal bus, said first router having a single data link for interconnecting said internal bus to said first bus only;

means for connecting said first bus to a second router external of the semiconductor die, the second router being connected to an external bus having additional components connected thereto, wherein said plurality of individual microcomputers are selectively interconnected to the additional components via said second router; and, means provided on said first bus for resolving access conflicts between said plurality of individual microcomputer in which any defective individual microcomputer can be assigned an unused logical address to render that microcomputer inactive;

and in which a test scan chain is provided on the die, the test scan chain passing through every router on the die to enable testing and bootstrapping of the individual microcomputers.

12. A microcomputer die structure according to claim 11 in which the second router is adjacent an edge of the die.

13. A semiconductor chip comprising a semiconductor die structure according to claim 12 packaged as a chip.

14. A microcomputer die structure according to claim 11 in which two second routers are connected to the first bus at spaced locations and adjacent an edge of the die.

15. A microcomputer die structure according to claim 11 in which at least two identical, independent second routers are connected in parallel to each other at an end of the first bus.

16. A microcomputer die structure according to claim 11 in which the means for resolving conflicts comprises a first loop passing through all the first routers and indicating the presence of activity on the first bus and a second loop passing through all the first routers for assigning access priorities.

17. A microcomputer die structure according to claim 11 in which the means for resolving conflicts comprises a line passing through all the first routers and indicating the presence of activity on the first bus and a loop for assigning access priorities, the loop having a first path passing through all the first routers and a second path passing through some of the first routers.

18. A microcomputer die structure according to claim 11 in which each first router comprises two dual port buffers, conductor means connecting one port from each other to an input for a bus and connecting the other port from each other buffer to an input for another bus.

* * * * *